United States Patent
Miyamoto et al.

(10) Patent No.: US 7,379,323 B2
(45) Date of Patent: May 27, 2008

(54) MEMORY WITH A REFRESH PORTION FOR REWRITING DATA

(75) Inventors: Hideaki Miyamoto, Ogaki (JP); Shigeharu Matsushita, Katano (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/524,273

(22) Filed: Sep. 21, 2006

(65) Prior Publication Data

US 2007/0070764 A1    Mar. 29, 2007

(30) Foreign Application Priority Data

Sep. 27, 2005    (JP)    ............... 2005-279013

(51) Int. Cl.
*G11C 11/22*    (2006.01)
*G11C 11/406*    (2006.01)
*G06F 12/00*    (2006.01)
*G06F 13/00*    (2006.01)

(52) U.S. Cl. ................. 365/145; 365/222; 365/230.03; 711/106

(58) Field of Classification Search ........... 365/145, 365/222, 230.03; 711/106
See application file for complete search history.

(56) References Cited

U.S. PATENT DOCUMENTS

| | | | | |
|---|---|---|---|---|
| 5,777,921 A | * | 7/1998 | Takata et al. ............... | 365/145 |
| 5,969,981 A | * | 10/1999 | Kono ........................ | 365/145 |
| 6,765,838 B2 | * | 7/2004 | Matsumoto et al. ........ | 365/222 |
| 6,809,951 B2 | * | 10/2004 | Yamaguchi ................. | 365/145 |
| 2003/0058681 A1 | * | 3/2003 | Coulson .................... | 365/145 |
| 2005/0207201 A1 | * | 9/2005 | Madan et al. ............... | 365/145 |

FOREIGN PATENT DOCUMENTS

JP    2003-7051 A    1/2003

* cited by examiner

*Primary Examiner*—J. H. Hur
(74) *Attorney, Agent, or Firm*—McDermott Will & Emery LLP

(57) ABSTRACT

This memory comprises a first frequency detecting portion detecting access frequencies with respect to a plurality of memory cell blocks respectively, a comparator comparing the access frequencies with respect to the plurality of memory cell blocks detected by the first frequency detecting portion with each other and a refresh portion exercising control for selecting a prescribed memory cell block from among the plurality of memory cell blocks on the basis of comparison data output from the comparator and preferentially rewriting data in the memory cells included in the selected memory cell block.

17 Claims, 9 Drawing Sheets

MEMORY WITH A REFRESH PORTION FOR REWRITING DATA

BACKGROUND OF THE INVENTION

1. Field of the Invention

The present invention relates to a memory, and more particularly, it relates to a memory comprising a refresh portion for rewriting data in memory cells.

2. Description of the Background Art

In relation to a ferroelectric memory, a disturbance is generally known as such a phenomenon that data disappear due to reduction in the quantities of polarization of ferroelectric capacitors resulting from application of a prescribed voltage to memory cells connected to word lines other than a selected word line in a rewrite operation after a read operation and a write operation on the memory cells including the ferroelectric capacitors. A conventional ferroelectric memory comprising a refresh portion exercising control for rewriting data in (refreshing) memory cells including ferroelectric capacitors in order to suppress such a disturbance is known in general. When access frequencies with respect to all memory cells reach a prescribed number of times, this conventional ferroelectric memory forcibly sequentially refreshes all memory cells with the refresh portion, thereby suppressing disturbances resulting from reduction in the quantities of polarization of the ferroelectric capacitors.

In the aforementioned conventional ferroelectric memory sequentially refreshing all memory cells, however, already refreshed memory cells are disadvantageously disturbed due to refresh operations on the remaining memory cells before the refresh portion completely refreshes all memory cells. Thus, the frequency of disturbances caused in the refreshed memory cells is disadvantageously increased.

In this regard, Japanese Patent Laying-Open No. 2003-7051, for example, proposes a ferroelectric memory for overcoming the disadvantage of the aforementioned conventional ferroelectric memory.

In the ferroelectric memory proposed in the aforementioned Japanese Patent Laying-Open No. 2003-7051, a memory cell array is divided into a plurality of memory cell arrays (memory cell blocks) each including a plurality of memory cells so that the ferroelectric memory refreshes a memory cell block exhibiting an access frequency reaching a prescribed number of times requiring a refresh operation. Thus, the ferroelectric memory disclosed in the aforementioned Japanese Patent Laying-Open No. 2003-7051 restrictively refreshes the memory cell block exhibiting the access frequency reaching the prescribed number of times, whereby the frequency of disturbances caused in refreshed memory cells can be reduced.

However, the ferroelectric memory proposed in the aforementioned Japanese Patent Laying-Open No. 2003-7051 disadvantageously preferentially refreshes the plurality of memory cell blocks along the sequence of access frequencies reaching the prescribed number of times requiring a refresh operation. When a memory cell block exhibiting an access frequency fourthly reaching the prescribed number of times requiring a refresh operation is concentrically accessed while the refresh portion refreshes a memory cell block exhibiting an access frequency firstly reaching the prescribed number of times requiring a refresh operation, therefore, the ferroelectric memory proposed in the Japanese Patent Laying-Open No. 2003-7051 fourthly refreshes the memory cell block exhibiting the access frequency fourthly reaching the prescribed number of times requiring a refresh operation, and hence the access frequency with respect to the memory cell block exhibiting the access frequency fourthly reaching the prescribed number of times requiring a refresh operation disadvantageously remarkably exceeds the prescribed number of times requiring a refresh operation. Consequently, the number of disturbances accumulated in the memory cells included in the memory cell block exhibiting the access frequency fourthly reaching the prescribed number of times requiring a refresh operation is increased, to disadvantageously cause disappearance of data resulting from the accumulated disturbances.

SUMMARY OF THE INVENTION

The present invention has been proposed in order to solve the aforementioned problem, and an object of the present invention is to provide a memory capable of suppressing disappearance of data resulting from disturbances by preventing memory cells included in a concentrically accessed memory cell block from accumulation of disturbances.

In order to attain the aforementioned object, a memory according to an aspect of the present invention comprises a memory cell array including a plurality of memory cell blocks each having a plurality of nonvolatile memory cells, a first frequency detecting portion detecting access frequencies with respect to the plurality of memory cell blocks respectively, a comparator comparing the access frequencies with respect to the plurality of memory cell blocks detected by the first frequency detecting portion with each other and a refresh portion exercising control for selecting a prescribed memory cell block from among the plurality of memory cell blocks on the basis of comparison data output from the comparator and preferentially rewriting data in the memory cells included in the selected memory cell block.

The memory according to this aspect, provided with the comparator comparing the access frequencies with respect to the plurality of memory cell blocks detected by the first frequency detecting portion with each other as hereinabove described, can detect the memory cell block exhibiting the maximum access frequency among the plurality of memory cell blocks with the comparator. If the refresh portion is so formed as to select the memory cell block exhibiting the maximum access frequency every period for performing a rewrite operation (refresh operation) controlled by the refresh portion when the access frequencies with respect to at least two memory cell blocks reach a prescribed number of times requiring a refresh operation, therefore, the memory can preferentially refresh the memory cell block exhibiting the maximum access frequency every period for performing a refresh operation controlled by the refresh portion. If a prescribed memory cell block is concentrically accessed to exhibit the maximum access frequency, therefore, the memory can immediately refresh the prescribed memory cell block, thereby preventing the memory cells included in the prescribed memory cell block from accumulation of disturbances. Consequently, the memory can suppress disappearance of data resulting from disturbances.

In the memory according to the aforementioned aspect, the comparator preferably detects the memory cell block exhibiting the maximum access frequency among the plurality of memory cell blocks, and the refresh portion preferably exercises control for preferentially rewriting data in the memory cells included in the memory cell block exhibiting the maximum access frequency. According to this structure, the memory can easily preferentially refresh the memory cell block exhibiting the maximum access frequency every period for performing a refresh operation controlled by the refresh portion when the access frequencies with respect to at least two memory cell blocks reach the prescribed number of times requiring a refresh operation.

In the memory according to the aforementioned aspect, the comparator preferably detects the sequence of the access frequencies with respect to the plurality of memory cell blocks, and the refresh portion preferably exercises control for selecting a prescribed memory cell block from among the plurality of memory cell blocks on the basis of sequence data output from the comparator and rewriting data in the memory cells included in the selected memory cell block. According to this structure, the refresh portion can also select a memory cell block exhibiting the second maximum access frequency every period for performing a refresh operation, in addition to the memory cell block exhibiting the maximum access frequency. If the memory cell block exhibiting the maximum access frequency is accessed in a prescribed period for performing a refresh operation when the refresh portion performs the refresh operation in parallel with an access operation, therefore, the refresh portion can refresh the memory cell block exhibiting the second maximum access frequency in the prescribed period.

In the memory according to the aforementioned aspect, the refresh portion preferably rewrites data in parallel with an access operation. According to this structure, the refresh portion performs a refresh operation also in a period for performing an access operation, whereby the memory can end refresh operations on all memory cells in the memory cell array earlier than a case of performing a refresh operation only in a period for performing no access operation.

In the aforementioned memory having the refresh portion rewriting data in parallel with an access operation, the refresh portion may exercise control for preferentially rewriting data in the memory cells included in the memory cell block exhibiting the maximum access frequency among the memory cell blocks, included in the plurality of memory cell blocks, other than the memory cell block subjected to the access operation. According to this structure, the memory can preferentially refresh the memory cell block exhibiting the maximum access frequency while quickly ending refresh operations on all memory cells in the memory cell array.

In this case, the refresh portion preferably exercises control for rewriting data in the memory cells included in the memory cell block exhibiting the second maximum access frequency among the plurality of memory cell blocks when the access operation is performed on the memory cell block exhibiting the maximum access frequency among the plurality of memory cell blocks. If the memory cell block exhibiting the maximum access frequency is accessed in the prescribed period for performing a refresh operation when the refresh portion performs the refresh operation in parallel with the access operation, therefore, the memory can easily refresh the memory cell block exhibiting the second maximum access frequency in the prescribed period.

In the memory according to the aforementioned aspect, the refresh portion preferably rewrites data in a period including no access operation. According to this structure, the refresh portion can easily rewrite data without colliding with the access operation.

In the memory according to the aforementioned aspect, the refresh portion preferably rewrites data simultaneously with an access operation in a cycle period. According to this structure, the refresh portion can rewrite data in each cycle period while avoiding collision with an access operation, whereby the memory can quickly end the refresh operation.

In the memory according to the aforementioned aspect, the refresh portion preferably selects the memory cell block subjected to a rewrite operation controlled by the refresh portion on the basis of the comparison data output from the comparator every period for performing a rewrite operation controlled by the refresh portion. According to this structure, the memory controls the rewrite operation of the refresh portion on the basis of the latest comparison data, so that the refresh portion can easily preferentially refresh the memory cell block exhibiting the maximum access frequency at the point of time of the refresh operation.

In the memory according to the aforementioned aspect, the refresh portion preferably exercises control for continually rewriting data in the selected memory cell block until completely rewriting data in all memory cells included in the selected memory cell block. According to this structure, the memory may not be separately provided with a storage portion storing the range of the refresh operation in the prescribed memory cell block dissimilarly to a case of exchanging a memory cell block subjected to a refresh operation when the refresh portion not yet completely refreshes all memory cells included in the prescribed memory cell block. Thus, the structure of the memory can be simplified. When a memory cell block exhibiting an access frequency fourthly reaching the prescribed number of times requiring a refresh operation is concentrically accessed while the refresh portion refreshes a memory cell block exhibiting an access frequency firstly reaching the prescribed number of times requiring a refresh operation, for example, the refresh portion can refresh the memory cell block exhibiting the access frequency fourthly reaching the prescribed number of times requiring a refresh operation when completely refreshing the memory cell block exhibiting the access frequency firstly reaching the prescribed number of times requiring a refresh operation. Also when the memory controls the refresh portion to continually refresh the memory cell block until completely refreshing the memory cell block exhibiting the access frequency firstly reaching the prescribed number of times requiring a refresh operation, therefore, the memory cells included in the memory cell block exhibiting the access frequency fourthly reaching the prescribed number of times requiring a refresh operation can be prevented from accumulation of disturbances.

The memory according to the aforementioned aspect preferably further comprises a second frequency detecting portion detecting access frequencies with respect to all memory cells provided in the memory cell array, and the refresh portion preferably exercises control for selecting a prescribed memory cell block from among the plurality of memory cell blocks on the basis of the comparison data output from the comparator and preferentially rewriting data in the memory cells included in the selected memory cell block when the second frequency detecting portion detects that the total access frequency with respect to all memory cells has reached a prescribed number of times. According to this structure, the memory can periodically perform a refresh operation every constant access frequency, dissimilarly to a case of detecting the access frequencies with respect to the plurality of memory cell blocks respectively and performing a refresh operation every prescribed access frequency with respect to each of the plurality of memory cell blocks. Thus, the memory can exercise control such as that for temporarily queuing a normal access operation at the time of a refresh operation, whereby control of the memory can be simplified.

In this case, the memory preferably further comprises a plurality of word lines each connected with a prescribed number of memory cells and a holding portion holding presence/absence of an access operation every prescribed number of memory cells connected to each of the plurality of word lines, while the refresh portion preferably exercises control for selecting a prescribed memory cell block from among the plurality of memory cell blocks on the basis of the comparison data output from the comparator and data held in the holding portion and rewriting data in the memory cells included in the selected memory cell block when the second frequency detecting portion detects that the total access frequency with respect to all memory cells has reached the prescribed number of times. According to this structure, the memory can exercise control for performing no refresh operation on a prescribed memory cell block when the prescribed memory cell block is accessed through all word lines corresponding to the prescribed memory cell block. If the prescribed memory cell block is accessed through all word lines corresponding to the prescribed memory cell block, all memory cells included in the prescribed memory cell block are conceivably relatively uniformly accessed and conceivably relatively slightly influenced by disturbances. When the prescribed memory cell block is accessed through all word lines corresponding to the prescribed memory cell block, therefore, the frequency of disturbances caused in the memory cells at the time of a refresh operation can be reduced by exercising control for performing no refresh operation on the prescribed memory cell block when the prescribed memory cell block is accessed through all word lines corresponding to the prescribed memory cell block.

In the aforementioned memory comprising the holding portion, the refresh portion preferably exercises control for rewriting no data in the memory cells included in the selected memory cell block when the selected memory cell block is accessed through all word lines included in the selected memory cell block. In this case, the memory cells included in the selected memory cell block are conceivably relatively uniformly accessed and conceivably relatively slightly influenced by disturbances if the selected memory cell block is accessed through all word lines included in the selected memory cell block. Thus, the frequency of refresh operations can be reduced by exercising control for performing no rewrite operation on the memory cells included in the selected memory cell block when the selected memory cell block is accessed through all word lines included in the selected memory cell block.

In the memory according to the aforementioned aspect, the refresh portion preferably exercises control for preferentially rewriting data in the memory cells included in the selected memory cell block when the access frequency with respect to the selected memory cell block has reached a prescribed number of times. According to this structure, the memory can inhibit the refresh portion from refreshing the memory cells in a memory cell block exhibiting a relatively small access frequency, whereby the frequency of disturbances caused in the memory cells can be reduced also according to this structure.

The memory according to the aforementioned aspect preferably further comprises a plurality of word lines each connected with a prescribed number of memory cells, while the refresh portion preferably exercises control for rewriting data in the plurality of memory cells linked to a single word line with respect to the memory cells included in the selected memory cell block. According to this structure, the frequency of refresh operations can be reduced as compared with a case of individually refreshing the memory cells respectively.

In this case, the memory preferably further comprises a storage portion storing the range of the word lines of the memory cell blocks subjected to rewrite operations. According to this structure, the storage portion can specify the range of the word lines of the memory cell blocks subjected to rewrite operations, whereby the memory can prevent the refresh portion from refreshing the word lines subjected to rewrite operations again.

In the memory according to the aforementioned aspect, the memory cells may include ferroelectric capacitors having ferroelectric films.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings. Each of the following embodiments is described with reference to a ferroelectric memory employed as an exemplary memory according to the present invention.

First Embodiment

The structure of a ferroelectric memory according to a first embodiment of the present invention is now described with reference to FIGS. 1 to 7.

Figure 1:
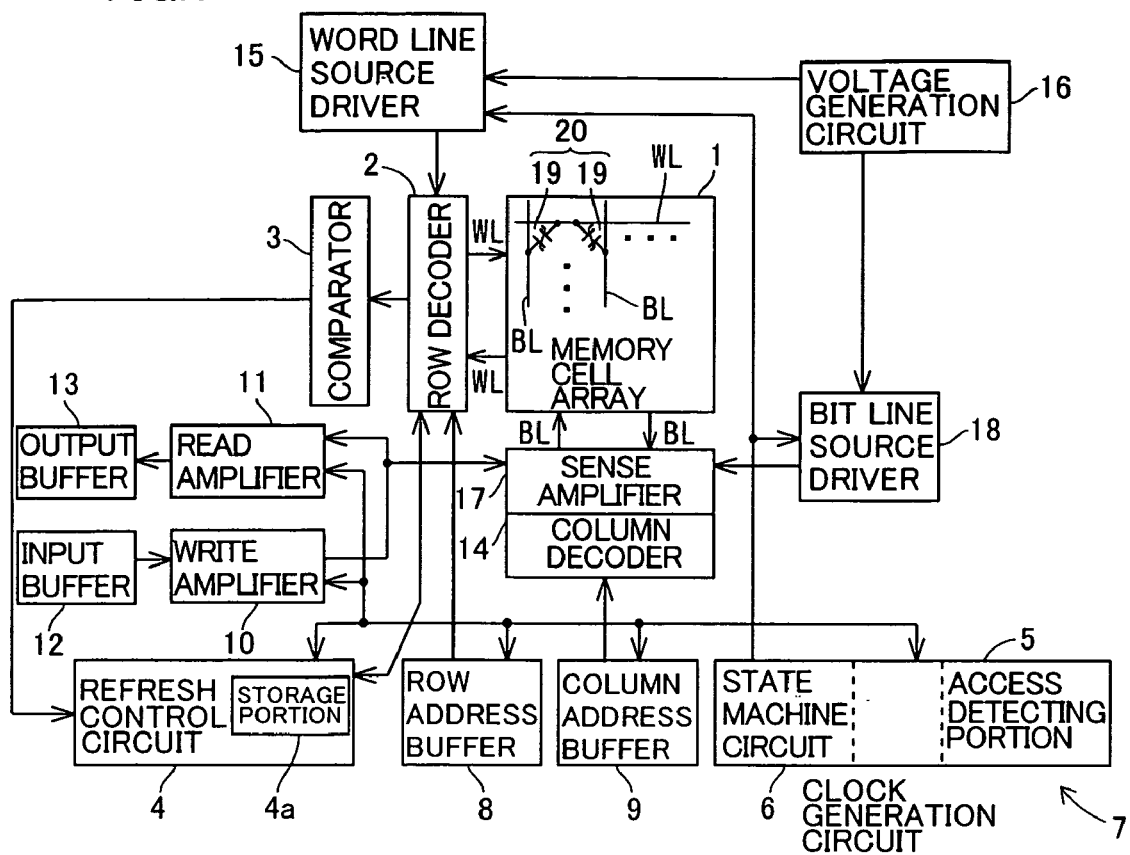
FIG. 1 is a model diagram for illustrating the overall structure of a ferroelectric memory according to a first embodiment of the present invention.

As shown in FIG. 1, the ferroelectric memory according to the first embodiment comprises a memory cell array 1, a row decoder 2, a comparator 3, a refresh control circuit 4 having a storage portion 4a, a clock generation circuit 7 including an access detecting portion 5 and a state machine circuit 6, a row address buffer 8, a column address buffer 9, a write amplifier 10, a read amplifier 11, an input buffer 12, an output buffer 13, a column decoder 14, a word line source driver 15, a voltage generation circuit 16, a sense amplifier 17 and a bit line source driver 18. The refresh control circuit 4 is an example of the "refresh portion" in the present invention.

In the memory cell array 1, a plurality of word lines WL and a plurality of bit lines BL are arranged to intersect with each other while ferroelectric capacitors 19 are provided on the intersections therebetween respectively. The ferroelectric capacitors 19 are constituted of the word lines WL, the bit lines BL and ferroelectric films (not shown) arranged between the word lines WL and the bit lines BL. Each pair of ferroelectric capacitors 19 constitute each memory cell 20.

Figure 2:
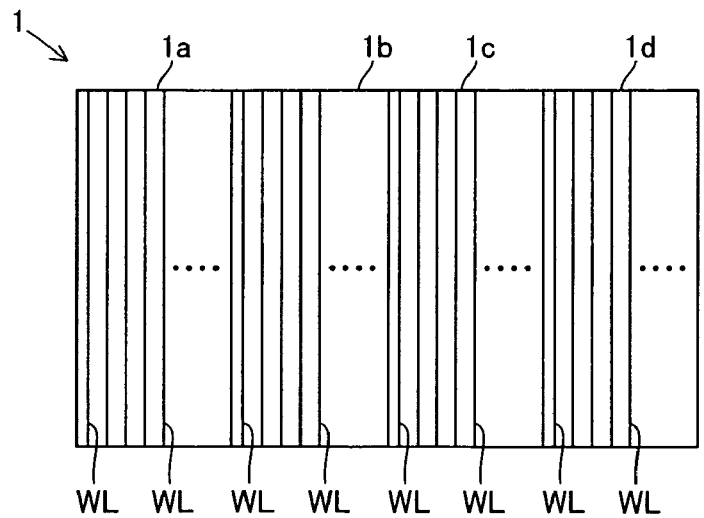
FIGS. 2 and 3 are model diagrams for more detailedly illustrating the structure of the ferroelectric memory according to the first embodiment shown in FIG. 1.

As shown in FIG. 2, the memory cell array 1 is constituted of four memory cell blocks 1a to 1d. 128 word lines WL are arranged in each of the memory cell blocks 1a to 1d.

Figure 3:
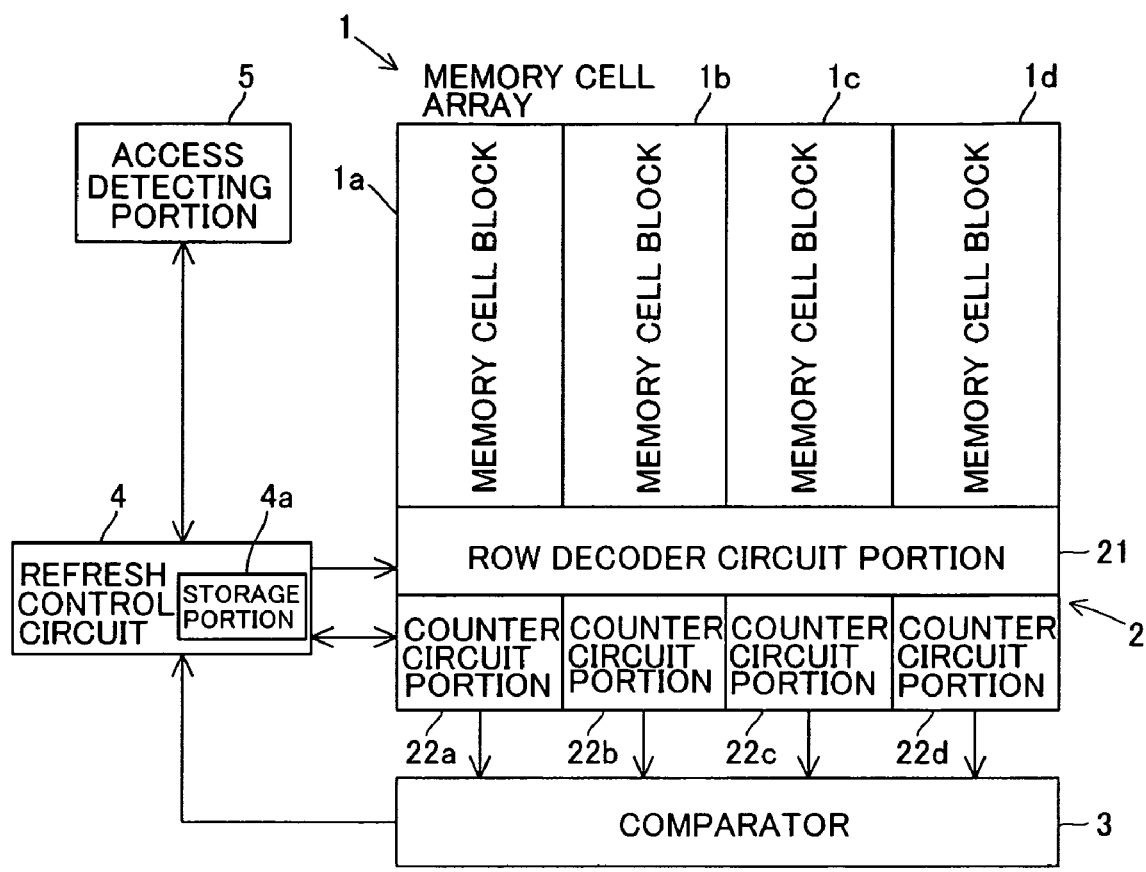

As shown in FIG. 3, all word lines WL (see FIG. 2) corresponding to the memory cell blocks 1a to 1d are connected to the row decoder 2. This row decoder 2 is constituted of a row decoder circuit portion 21 and four counter circuit portions 22a to 22d provided one by one for the memory cell blocks 1a to 1d respectively. The counter circuit portions 22a to 22d are examples of the "first frequency detecting portion" in the present invention. Each of the counter circuit portions 22a to 22d has a function of detecting an access frequency (frequency of read and write operations) with respect to the corresponding one of the four memory cell blocks 1a to 1d. When the memory cells 20 (see FIG. 1) included in the memory cell block 1a are accessed once among the four memory cell blocks 1a to 1d, for example, the corresponding counter circuit portion 22a increases the count thereof by +1 among the four counter circuit portions 22a to 22d. The counter circuit portions 22a to 22d convert the counts detected therein to 10-bit count signals CNTA to CNTD (see FIG. 4) and output these count signals CNTA to CNTD respectively.

According to the first embodiment, the comparator 3 is connected to the counter circuit portions 22a to 22d. This comparator 3 has a function of detecting the one exhibiting the maximum access frequency among the four memory cell blocks 1a to 1d by comparing the counts detected by the counter circuit portions 22a to 22d respectively with each other.

Figure 4:
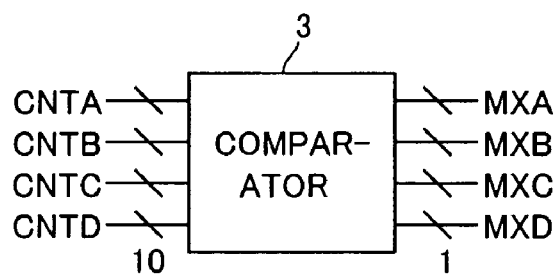
FIG. 4 is a model diagram for illustrating the structure of a comparator in the ferroelectric memory according to the first embodiment shown in FIG. 1.

More specifically, the comparator 3 is so formed as to output 1-bit output signals MXA to MXD as comparison data when receiving the count signals CNTA to CNTD from the counter circuit portions 22a to 22d (see FIG. 3), as shown in FIG. 4. The 1-bit output signals MXA to MXD correspond to the memory cell blocks 1a to 1d (see FIG. 3) respectively. When the memory cell block 1a exhibits the maximum access frequency, for example, the output signal MXA is "1" while the remaining output signals MXB to MXD are "0". In other words, the comparator 3 is so formed that the output signal corresponding to the one exhibiting the maximum access frequency among the four memory cell blocks 1a to 1d is "1" and the output signals corresponding to the remaining ones are "0".

Figure 5:
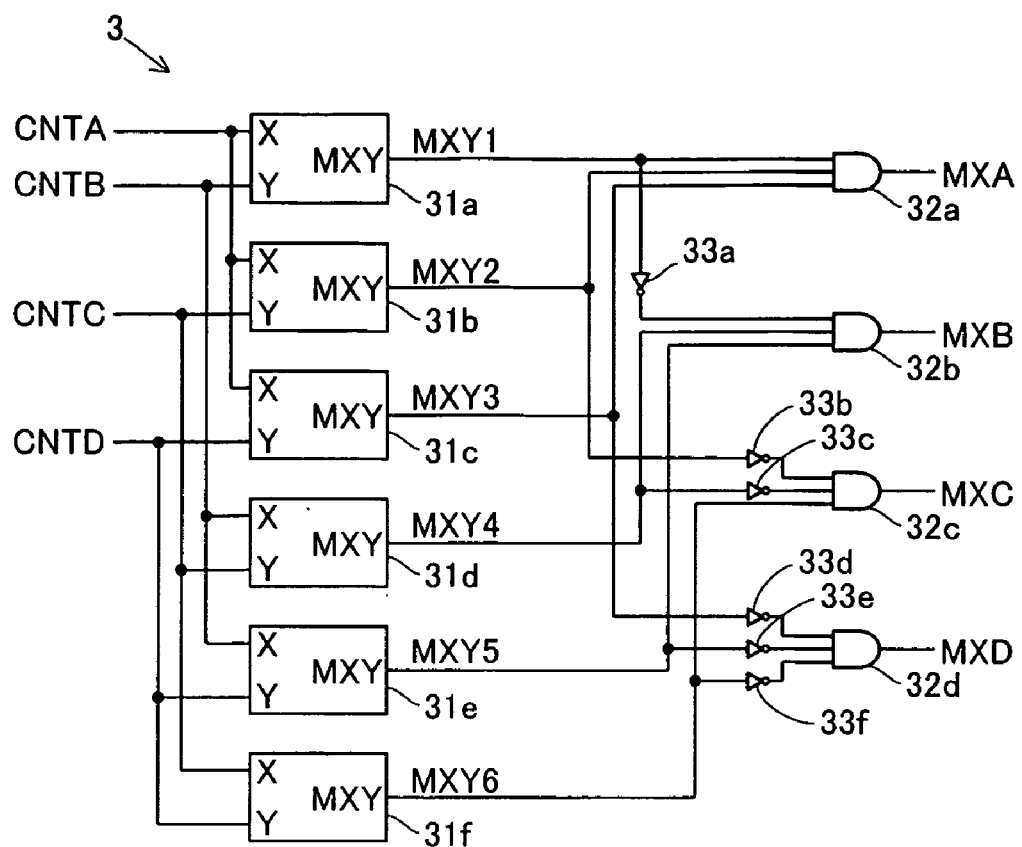
FIGS. 5 to 7 are circuit diagrams for more detailedly illustrating the structure of the comparator in the ferroelectric memory according to the first embodiment shown in FIG. 1.

More specifically, six comparators 31a to 31f each comparing two 10-bit signals with each other are arranged in the comparator 3, as shown in FIG. 5. Each of the comparators 31a to 31f is provided with two input terminals X and Y and an output terminal MXY. The input terminals X and Y of the comparator 31a receive the count signals CNTA and CNTB respectively. The input terminals X and Y of the comparator 31b receive the count signals CNTA and CNTC respectively. The input terminals X and Y of the comparator 31c receive the count signals CNTA and CNTD respectively. The input terminals X and Y of the comparator 31d receive the count signals CNTB and CNTC respectively. The input terminals X and Y of the comparator 31e receive the count signals CNTB and CNTD respectively. The input terminals X and Y of the comparator 31f receive the count signals CNTC and CNTD respectively. The output terminals MXY of the comparators 31a to 31f output 1-bit output signals MXY1 to MXY6 respectively.

Four AND circuit portions 32a to 32d are also arranged in the comparator 3. Input terminals of the AND circuit 32a receive the output signals MXY1, MXY2 and MXY3 respectively. Input terminals of the AND circuit portion 32b receive the output signals MXY1, MXY4 and MXY5 respectively. However, an inverter 33a inverts the output signal MXY1 input in the AND circuit portion 32b. Input terminals of the AND circuit portion 32c receive the output signals MXY2, MXY4 and MXY6 respectively. However, inverters 33b and 33c invert the output signals MXY2 and MXY4 input in the AND circuit portion 32c respectively. Input terminals of the AND circuit portion 32d receive the output signals MXY3, MXY5 and MXY6 respectively. However, inverters 33d, 33e and 33f invert the output signals MXY3, MXY5 and MXY6 input in the AND circuit portion 32d respectively. The AND circuit portions 32a to 32d output the aforementioned output signals MXA to MXD of the comparator 3 respectively.

Figure 6:
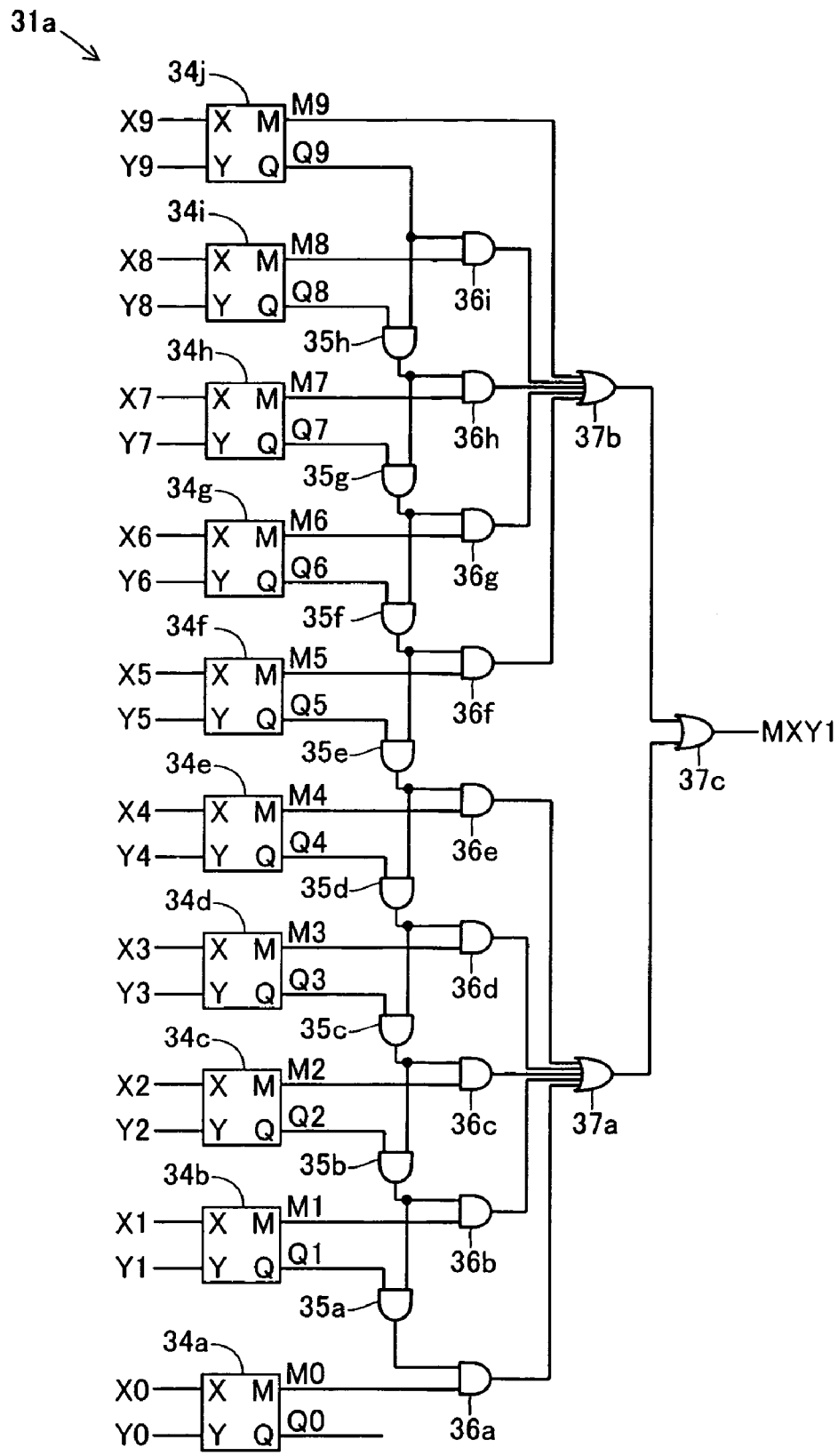

10 comparators 34a to 34j each comparing two 1-bit signals with each other are arranged in the comparator 31a, as shown in FIG. 6. Input terminals X of the comparators 34a to 34j receive 1-bit signals X0 to X9 constituting the 10-bit count signal CNTA respectively. When a count is 1000 times, for example, the count signal CNTA is "1111101000". Therefore, the 1-bit signals X0 to X9 input in the input terminals X of the comparators 34a to 34j are "0", "0", "0", "1", "0", "1", "1", "1", "1" and "1" respectively. Input terminals X of the comparators 34a to 34j receive 1-bit signals Y0 to Y9 constituting the 10-bit count signal CNTB respectively. Output terminals M and Q of the comparators 34a to 34j output 1-bit output signals M0 to M9 and Q0 to Q9 respectively.

17 AND circuit portions 35a to 35h and 36a to 36i are also arranged in the comparator 31a. First input terminals of the AND circuit portions 35a to 35h receive the output signals Q1 to Q8 respectively. Second input terminals of the AND circuit portions 35a to 35g receive output signals from the AND circuit portions 35b to 35h respectively, while a second input terminal of the AND circuit portion 35h receives the output signal Q9. First input terminals of the AND circuit portions 36a to 36i receive the output signals M0 to M8 respectively. Second input terminals of the AND circuit portions 36a to 36h receive output signals from the AND circuit portions 35a to 35h respectively, while a second input terminal of the AND circuit portion 36i receives the output signal Q9.

Three OR circuit portions 37a to 37c are further arranged in the comparator 31a. Input terminals of the OR circuit portion 37a receive output signals from the AND circuit portions 36a to 36e respectively. Input terminals of the OR circuit portion 37b receive the output signal M9 and output signals from the AND circuit portions 36f to 36i respectively. Input terminals of the OR circuit portion 37c receive output signals from the OR circuit portions 37a and 37b respectively. The OR circuit portion 37c outputs the aforementioned output signal MXY1 from the comparator 31a.

The comparators 31b to 31f shown in FIG. 5 are similar in circuit structure to the aforementioned comparator 31a.

Figure 7:
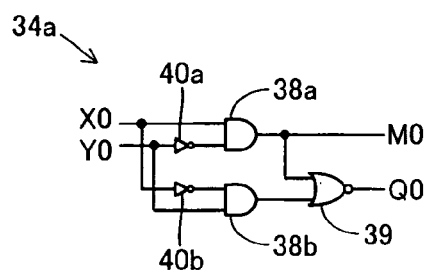

As shown in FIG. 7, two AND circuit portions 38a and 38b and a NOR circuit portion 39 are arranged in the comparator 34a. Input terminals of the AND circuit portion 38a receive the 1-bit signals X0 and Y0 respectively. However, an inverter 40a inverts the 1-bit signal Y0 input in the AND circuit portion 38a. Input terminals of the AND circuit portion 38b receive the 1-bit signals X0 and Y0 respectively. However, an inverter 40b inverts the 1-bit signal X0 input in the AND circuit portion 38b.

Input terminals of the NOR circuit portion 39 receive output signals from the AND circuit portions 38a and 38b respectively. The AND circuit portion 38a and the NOR circuit portion 39 output the aforementioned output signals M0 and Q0 from the comparator 34a respectively.

The comparators 34b to 34j shown in FIG. 6 are similar in circuit structure to the aforementioned comparator 34a.

According to the first embodiment, the comparator 3 having the aforementioned structure can detect the one exhibiting the maximum access frequency among the four memory cell blocks 1a to 1d (see FIG. 3).

According to the first embodiment, the refresh control circuit 4 is connected to the row decoder 2 and the comparator 3, as shown in FIG. 3. The refresh control circuit 4 according to the first embodiment has a function of controlling refresh operations (rewrite operations) on the memory cells 20 (see FIG. 1) on the basis of the aforementioned comparison data (output signals MXA to MXD) output from the comparator 3.

Assuming that the memory cell block 1a exhibits the maximum access frequency among the four memory cell blocks 1a to 1d, for example, the refresh control circuit 4 selects the memory cell block 1a exhibiting the maximum access frequency from among the four memory cell blocks 1a to 1d and thereafter refreshes the memory cells 20 (see FIG. 1) included in the selected memory cell block 1a when the count detected by the counter circuit portion 22a corresponding to the selected memory cell block 1a has reached a prescribed number of times. The access detecting portion 5 is connected to the refresh control circuit 4. This access detecting portion 5 has a function of detecting access operations (read and write operations) with respect to the memory cells 20.

As shown in FIG. 1, the access detecting portion 5 (clock generation circuit 7) is connected to the row address buffer 8, the column address buffer 9, the write amplifier 10 and the read amplifier 11. The input buffer 12 and the output buffer 13 are connected to the write amplifier 10 and the read amplifier 11 respectively. The row address buffer 8 and the column address buffer 9 are connected to the row decoder 2 and the column decoder 14 respectively. The word line source driver 15 is connected to the row decoder 2, while the voltage generation circuit 16 and the state machine circuit 6 of the clock generation circuit 7 are connected to the word line source driver 15. The column decoder 14 is connected to the bit lines BL of the memory cell array 1 through the sense amplifier 17. The write amplifier 10, the read amplifier 11 and the bit line source driver 18 are connected to the sense amplifier 17, while the voltage generation circuit 16 and the state machine circuit 6 are connected to the bit line source driver 18.

Operations of the ferroelectric memory according to the first embodiment are now described with reference to FIGS. 1 to 8.

In the ferroelectric memory according to the first embodiment, all of the four counter circuit portions 22a to 22d shown in FIG. 3 are reset upon power supply, so that the 10-bit count signals CNTA to CNTD (see FIG. 4) output from the counter circuit portions 22a to 22d are "0".

Thereafter the access detecting portion 5 detects an access operation, so that the ferroelectric memory starts accessing the memory cells 20 (see FIG. 1). When the ferroelectric memory accesses the memory cells 20 included in the memory cell block 1a, for example, the counter circuit portion 22a increases the count thereof by +1. Thus, the count signal CNTA output from the counter circuit portion 22a reaches "1". In this case, the ferroelectric memory holds the count signals CNTB to CNTD output from the counter circuit portions 22b to 22d corresponding to the memory cell blocks 1b to 1d respectively in the states of "0".

When the access operation with respect to the memory cells 20 is a read operation, the row decoder 2 selects a word line WL corresponding to a row address externally input in the ferroelectric memory, as shown in FIG. 1. Thus, the sense amplifier 17 collectively reads data from the memory cells 20 connected to the selected word line WL through the corresponding bit lines BL and amplifies the data. The ferroelectric memory reads the data amplified by the sense amplifier 17 through the read amplifier 11 and the output buffer 13. Thereafter the ferroelectric memory rewrites data in the memory cells 20 from which the data have been read.

When the access operation with respect to the memory cells 20 is a write operation, on the other hand, the sense amplifier 17 reads the data of the memory cells 20 connected to the selected word line WL and the ferroelectric memory thereafter replaces the read data with externally received data. Thereafter the ferroelectric memory writes the data in the memory cells 20 through the sense amplifier 17.

In the aforementioned rewrite operation after the read operation and a write operation, the ferroelectric memory applies a prescribed voltage (½Vcc or ⅓Vcc) to the memory cells 20 connected to the word lines WL (hereinafter referred to nonselected word lines WL) other than the selected word line WL in that of the four memory cell blocks 1a to 1d (see FIG. 2) including the selected word line WL. Thus, the quantities of polarization of the ferroelectric capacitors 19 are reduced to cause disturbances in the memory cells 20 connected to the nonselected word lines WL in that of the four memory cell blocks 1a to 1d including the selected word line WL.

As shown in FIG. 3, the ferroelectric memory performs the aforementioned access operation every time the access detecting portion 5 detects an access operation. Therefore, the corresponding one of the four counter circuit portions 22a to 22d accumulates the count every time the access detecting portion 5 detects an access operation.

According to the first embodiment, the comparator 3 compares the access frequencies with respect to the memory cell blocks 1a to 1d with each other every time the access detecting portion 5 detects an access operation. Comparison of the comparator 3 is now described with reference to a case where the access frequencies with respect to the memory cell blocks 1a, 1b, 1c and 1d are 1000 times, 1001 times, 1002 times and 1003 times respectively.

When the access frequency with respect to the memory cell block 1a is 1000 times, the count signal CNTA output from the counter circuit portion 22a is "1111101000", as shown in FIGS. 3 and 4. When the access frequency with respect to the memory cell block 1b is 1001 times, the count signal CNTB output from the counter circuit portion 22b is "1111101001". When the access frequency with respect to the memory cell block 1c is 1002 times, the count signal CNTC output from the counter circuit portion 22c is "1111101010". When the access frequency with respect to the memory cell block 1d is 1003 times, the count signal CNTD output from the counter circuit portion 22d is "1111101011".

As shown in FIG. 5, the comparator 31a included in the comparator 3 receives the count signals CNTA and CNTB in the input terminals X and Y respectively. The comparator 31b receives the count signals CNTA and CNTC in the input terminals X and Y respectively. The comparator 31c receives the count signals CNTA and CNTD in the input terminals X and Y respectively. The comparator 31d receives the count signals CNTB and CNTC in the input terminals X and Y respectively. The comparator 31e receives the count signals CNTB and CNTD in the input terminals X and Y respectively. The comparator 31f receives the count signals CNTC and CNTD in the input terminals X and Y respectively.

More specifically, the 1-bit signals X0 to X9 input in the input terminals X of the comparators 34a to 34j constituting the comparator 31a receiving the count signals CNTA and CNTB are "0", "0", "0", "1", "0", "1", "1", "1", "1" and "1" respectively, as shown in FIG. 6. Further, the 1-bit signals Y0 to Y9 input in the input terminals Y of the comparators 34a to 34j are "1", "0", "0", "1", "0", "1", "1", "1", "1" and "1" respectively.

At this time, the inverter 40a inverts the 1-bit signal Y0 input in the AND circuit portion 38a to "0" in the comparator 34a, as shown in FIG. 7. Thus, the AND circuit portion 38a outputs a signal having a bit value "0". On the other hand, the inverter 40b inverts the bit signal X0 input in the AND circuit portion 38b to "1". Thus, the AND circuit portion 38b outputs a signal having a bit value "1". Therefore, the NOR circuit portion 39 receiving the signals having the bit values "0" and "1" respectively outputs a signal having a bit value "0". Consequently, the output signals M0 and Q0 from the comparator 34a shown in FIG. 6 are "0" and "0" respectively.

The comparators 34b to 34j operate similarly the aforementioned comparator 34a. In other words, the output signals M1 to M9 and Q1 to Q9 from the comparators 34b to 34j are "0" and "1" respectively.

As shown in FIG. 6, the AND circuit portion 35h receiving the output signals Q9 and Q8 of the bit values "1" outputs a signal having a bit value "1". The AND circuit portion 35g receiving the output signal Q7 of the bit value "1" and the output signal of the bit value "1" from the AND circuit portion 35h outputs a signal having a bit value "1". The AND circuit portion 35f receiving the output signal Q6 of the bit value "1" and the output signal of the bit value "1" from the AND circuit portion 35g outputs a signal having a bit value "1". The AND circuit portion 35e receiving the output signal Q5 of the bit value "1" and the output signal of the bit value "1" from the AND circuit portion 35f outputs a signal having a bit value "1". The AND circuit portion 35d receiving the output signal Q4 of the bit value "1" and the output signal of the bit value "1" from the AND circuit portion 35e outputs a signal having a bit value "1". The AND circuit portion 35c receiving the output signal Q3 of the bit value "1" and the output signal of the bit value "1" from the AND circuit portion 35d outputs a signal having a bit value "1". The AND circuit portion 35b receiving the output signal Q2 of the bit value "1" and the output signal of the bit value "1" from the AND circuit portion 35c outputs a signal having a bit value "1". The AND circuit portion 35a receiving the output signal Q1 of the bit value "1" and the output signal of the bit value "1" from the AND circuit portion 35b outputs a signal having a bit value "1".

The AND circuit portion 36a receiving the output signal M0 of the bit value "0" and the output signal of the bit value "1" from the AND circuit portion 35a outputs a signal having a bit value "0". The AND circuit portion 36b receiving the output signal M1 of the bit value "0" and the output signal of the bit value "1" from the AND circuit portion 35b outputs a signal having a bit value "0". The AND circuit portion 36c receiving the output signal M2 of the bit value "0" and the output signal of the bit value "1" from the AND circuit portion 35c outputs a signal having a bit value "0". The AND circuit portion 36d receiving the output signal M3 of the bit value "0" and the output signal of the bit value "1" from the AND circuit portion 35d outputs a signal having a bit value "0". The AND circuit portion 36e receiving the output signal M4 of the bit value "0" and the output signal of the bit value "1" from the AND circuit portion 35e outputs a signal having a bit value "0".

The AND circuit portion 36f receiving the output signal M5 of the bit value "0" and the output signal of the bit value "1" from the AND circuit portion 35f outputs a signal having a bit value "0". The AND circuit portion 36g receiving the output signal M6 of the bit value "0" and the output signal of the bit value "1" from the AND circuit portion 35g outputs a signal having a bit value "0". The AND circuit portion 36h receiving the output signal M7 of the bit value "0" and the output signal of the bit value "1" from the AND circuit portion 35h outputs a signal having a bit value "0" The AND circuit portion 36i receiving the output signals M8 and M9 of the bit values "0" and "1" outputs a signal having a bit value "0".

The OR circuit portion 37a receiving the output signals of the bit values "0" from the AND circuit portions 36a to 36e outputs a signal having a bit value "0". The OR circuit portion 37b receiving the output signals of the bit values "0" from the AND circuit portions 36f to 36i and the output signal M9 of the bit value "0" outputs a signal having a bit value "0". Therefore, the OR circuit portion 37c receiving the two signals of the bit values "0" outputs a signal having a bit value "0". Consequently, the output signal MXY1 from the comparator 31a shown in FIG. 5 is "0".

The comparators 31b to 31f operate similarly to the aforementioned comparator 31a. In other words, all of the output signals MXY2 to MXY6 from the comparators 31b to 31f are "0".

Thus, the AND circuit portion 32a receives the output signals MXY1 to MXY3 of the bit values "0", as shown in FIG. 5. The AND circuit portion 32b receives the output signal MXY1 of the inverted bit value "1" and the output signals MXY4 and MXY5 of the bit values "0". The AND circuit portion 32c receives the output signals MXY2 and MXY4 of the inverted bit values "1" and the output signal MXY6 of the bit value "0". The AND circuit portion 32d receives the output signals MXY3, MXY5 and MXY6 of the inverted bit values "1".

Consequently, the output signals MXA and MXB corresponding to the memory cell blocks 1a and 1b are "0" respectively. Further, the output signals MXC and MXD corresponding to the memory cell blocks 1c and 1d are "0" and "1" respectively. Thus, the comparator 3 detects that the memory cell block 1d exhibits the maximum access frequency.

Figure 8:
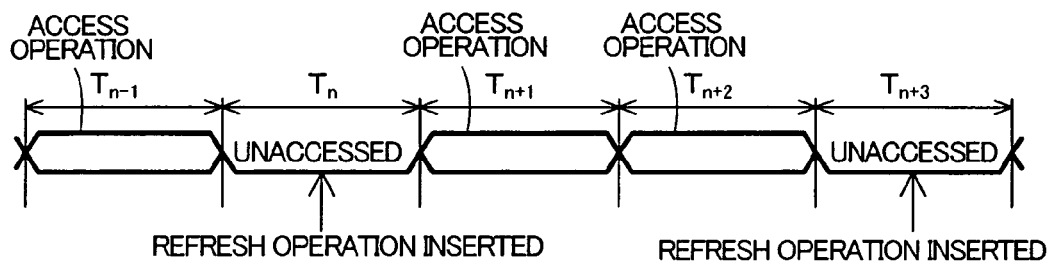
FIG. 8 is a diagram for illustrating exemplary operations of the ferroelectric memory according to the first embodiment of the present invention.

According to the first embodiment, the ferroelectric memory inserts a refresh operation into a period T, for performing no access operation, as shown in FIG. 8. A refresh operation performed in a period $T_{n-1}$ when the access frequencies with respect to the memory cell blocks 1a, 1b, 1c and 1d are 1000, 1001, 1002 and 1003 times respectively is now described.

According to the first embodiment, the refresh control circuit 4 selects the one exhibiting the maximum access frequency from among the four memory cell blocks 1a to 1d on the basis of the output signals MXA to MXD output from the comparator 3 every period for performing a refresh operation. Upon occurrence of the period $T_n$ for performing no access operation, the refresh control circuit 4 selects the memory cell block 1d exhibiting the maximum access frequency from among the four memory cell blocks 1a to 1d on the basis of the comparison data (output signals MXA to MXD) in the period $T_{n-1}$ for an access operation precedent to the period $T_n$. When the access frequency with respect to the memory cell block 1d has reached the prescribed number of times (1000 times, for example), the refresh control circuit 4 outputs a control signal for starting a refresh operation to the row decoder 2, in order to refresh the memory cells 20 included in the memory cell block 1d. Consequently, the ferroelectric memory refreshes the memory cells 20 through one of the 128 word lines WL included in the memory cell block 1d in the period $T_n$ for performing no access operation.

Upon reoccurrence of another period $T_{n+3}$ for performing no access operation after repetitive access operations, the refresh control circuit 4 selects a prescribed memory cell block exhibiting the maximum access frequency from among the four memory cell blocks 1a to 1d on the basis of the comparison data (output signals MXA to MXD) in a period $T_{n+2}$ for an access operation precedent to the period $T_{n+3}$. Assuming that the memory cells 20 included in the memory cell block 1c are repetitively accessed in a period $T_{n+1}$ and the period $T_{n+2}$, the memory cell block 1c exhibits the maximum access frequency. In this case, the refresh control circuit 4 exercises control for selecting the memory cell block 1c exhibiting the maximum access frequency from among the four memory cell blocks 1a to 1d and refreshing the memory cells 20 included in the selected memory cell block 1c in the period $T_{+3}$ for performing no access operation.

Thus, the ferroelectric memory repeats the aforementioned access operation and the aforementioned refresh operation. The storage portion 4a of the refresh control circuit 4 stores the word line WL up to which the corresponding memory cells 20 have been refreshed every one of the four memory cell blocks 1a to 1d. When completely refreshing all memory cells 20 included in the memory cell block 1a among the four memory cell blocks 1a to 1d, for example, the ferroelectric memory resets the corresponding counter circuit portion 22a.

According to the first embodiment, as hereinabove described, the ferroelectric memory is provided with the comparator 3 detecting the one exhibiting the maximum access frequency among the four memory cell blocks 1a to 1d by comparing the counts detected by the counter circuit portions 22a to 22d respectively with each other so that the refresh control circuit 4 can select the one exhibiting the maximum access frequency from among the four memory cell blocks 1a to 1d every period for performing a refresh operation controlled by the refresh control circuit 4 when the access frequencies with respect to at least two of the four memory cell blocks 1a to 1d have been reached the prescribed number of times requiring a refresh operation. Thus, the ferroelectric memory can preferentially refresh the one exhibiting the maximum access frequency among the four memory cell blocks 1a to 1d every period for performing a refresh operation controlled by the refresh control circuit 4. When a prescribed one of the four memory cell blocks 1a to 1d is concentrically accessed to exhibit the maximum access frequency, therefore, the ferroelectric memory can immediately refresh the prescribed memory cell block, thereby preventing the memory cells 20 included in the prescribed memory cell block from accumulation of disturbances. Consequently, the ferroelectric memory can suppress disappearance of data resulting from disturbances.

According to the first embodiment, as hereinabove described, the refresh control circuit 4 selects the one exhibiting the maximum access frequency from among the four memory cell blocks 1a to 1d on the basis of the output signals MXA to MXD output from the comparator 3 every period for performing a refresh operation thereby controlling the refresh operation on the basis of the latest comparison data (output signals MXA to MXD), whereby the ferroelectric memory can easily preferentially refresh the memory cell block exhibiting the maximum access frequency at the point of time of the refresh operation.

According to the first embodiment, as hereinabove described, the refresh control circuit 4 exercises control for preferentially refreshing the memory cells 20 included in the selected prescribed memory cell block when the access frequency with respect to the prescribed memory cell block selected by the refresh control circuit 4 from among the four memory cell blocks 1a to 1d reaches the prescribed number of times in a period for performing a refresh operation thereby suppressing a refresh operation in a stage of a relatively small access frequency, whereby the frequency of disturbances caused in the memory cells 20 can be reduced in the refresh operation.

Figure 9:
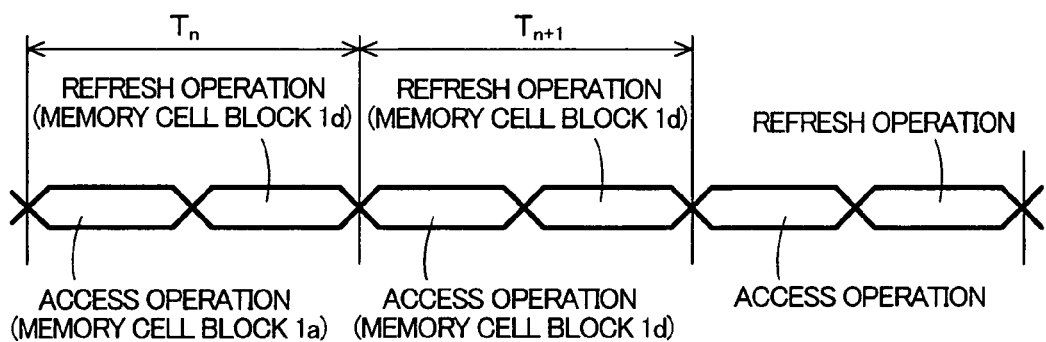
FIG. 9 is a diagram for illustrating operations of a ferroelectric memory according to a modification of the first embodiment.

Referring to FIG. 9, a ferroelectric memory according to a modification of the first embodiment performs both of an access operation and a refresh operation in one cycle period, dissimilarly to the ferroelectric memory according to the aforementioned first embodiment. A case where a memory cell block 1d exhibits the maximum access frequency is now described.

More specifically, the ferroelectric memory first accesses memory cells 20 included in a memory cell block 1a in a period $T_n$ shown in FIG. 9. Thereafter a refresh control circuit 4 selects the memory cell block 1d exhibiting the maximum access frequency on the basis of comparison data (output signals MXA to MXD) of a comparator 3 in the period $T_n$. Thus, the ferroelectric memory refreshes the memory cells 20 included in the memory cell block 1d. Further, the ferroelectric memory accesses the memory cells 20 included in the memory cell block 1d in a period $T_{n+1}$ shown in FIG. 9. Thereafter the refresh control circuit 4 selects the memory cell block 1d exhibiting the maximum access frequency on the basis of the comparison data (output signals MXA to MXD) of the comparator 3 in the period $T_{n+1}$. Thus, the ferroelectric memory refreshes the memory cells 20 included in the memory cell block 1d. In other words, the ferroelectric memory performs both of the access operation and the refresh operation on the memory cells 20 included in the same memory cell block 1d in one cycle period in the period $T_{n+1}$ shown in FIG. 9.

Also when the ferroelectric memory operates in the aforementioned manner, effects similar to those of the ferroelectric memory according to the aforementioned first embodiment can be attained.

Second Embodiment

Figure 10:
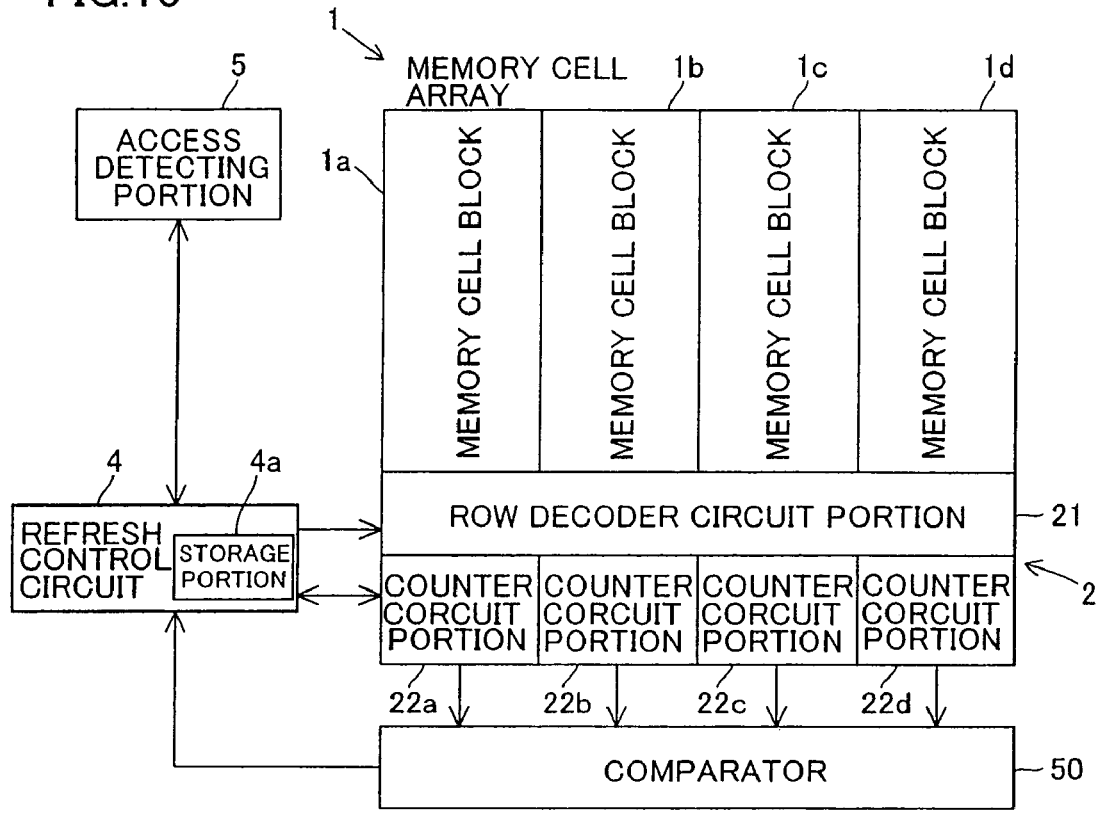
FIG. 10 is a model diagram for detailedly illustrating the structure of a ferroelectric memory according to a second embodiment of the present invention.
Figure 11:
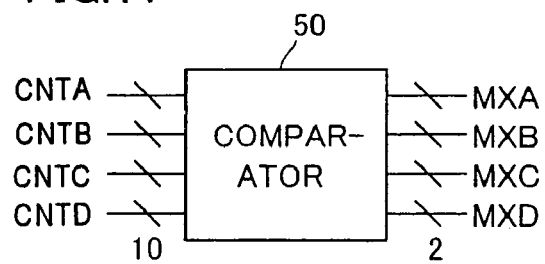
FIG. 11 is a model diagram for illustrating the structure of a comparator in the ferroelectric memory according to the second embodiment shown in FIG. 10.
Figure 12:
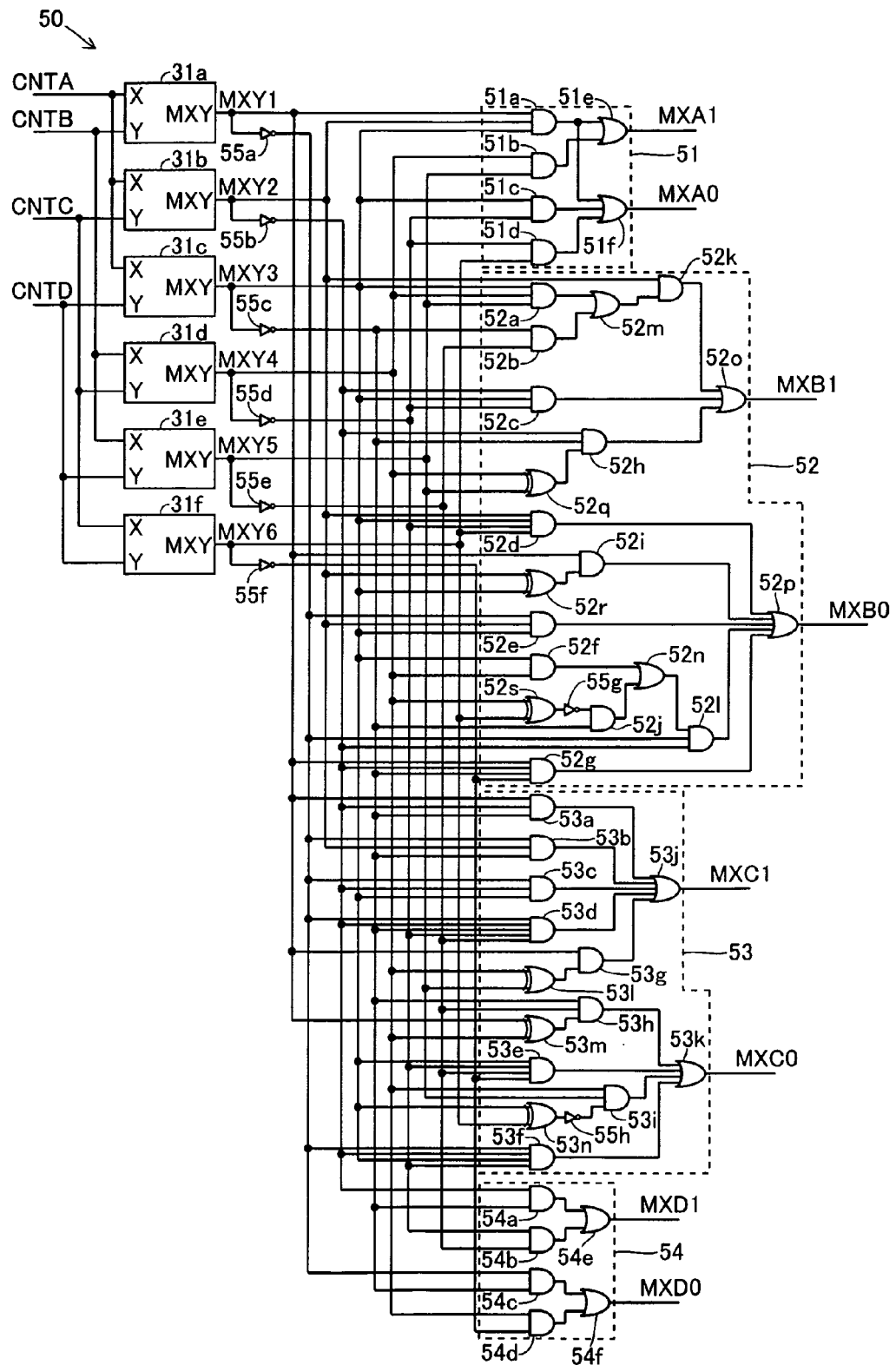
FIG. 12 is a circuit diagram for more detailedly illustrating the structure of the comparator in the ferroelectric memory according to the second embodiment shown in FIG. 11.

Referring to FIGS. 10 to 12, a ferroelectric memory according to a second embodiment of the present invention detects the sequence of access frequencies with respect to four memory cell blocks 1a to 1d, dissimilarly to the ferroelectric memory according to the aforementioned first embodiment.

According to the second embodiment, the ferroelectric memory is provided with a comparator 50 capable of detecting the sequence of the access frequencies with respect to the four memory cell blocks 1a to 1d in place of the comparator 3 in a structure similar to that of the ferroelectric memory according to the aforementioned first embodiment, as shown in FIG. 10. The remaining structure of the ferroelectric memory according to the second embodiment is similar to that of the ferroelectric memory according to the first embodiment.

As shown in FIG. 11, the comparator 50 of the ferroelectric memory according to the second embodiment is so formed as to output 2-bit output signals MXA to MXD as sequence data when receiving count signals CNTA to CNTD output from counter circuit portions 22a to 22d (see FIG. 10) respectively. These 2-bit output signals MXA to MXD correspond to the memory cell blocks 1a to 1d (see FIG. 10) respectively. When the access frequencies with respect to the four memory cell blocks 1a, 1b, 1c and 1d descend in this sequence, for example, the output signals MXA, MXB, MXC and MXD are "11", "10", "01" and "00" respectively. In other words, the comparator 50 is so formed that the output signals corresponding to the four memory cell blocks 1a to 1d are "11", "10", "01" and "00" along the sequence of the access frequencies.

More specifically, six comparators 31a to 31f each comparing two 10-bit signals with each other are arranged in the comparator 50, as shown in FIG. 12. These comparators 31a to 31f are similar in circuit structure to the comparators 31a to 31f arranged in the comparator 3 of the ferroelectric memory according to the first embodiment shown in FIG. 5 respectively. In other words, the comparators 31a to 31f output 1-bit output signals MXY1 to MXY6 respectively.

Further, circuit portions 51 to 54 corresponding to the output signals MXA to MXD respectively are also arranged in the comparator 50. The circuit portion 51 is constituted of four AND circuit portions 51a to 51d and two OR circuit portions 51e and 51f. The AND circuit portion 51a receives the output signals MXY1, MXY2 and MXY3. The AND circuit portion 51b receives the output signals MXY4 and MXY5. The AND circuit portion 51c receives the output signals MXY3 and MXY4. However, an inverter 55d inverts the output signal MXY4 input in the AND circuit portion 51c. The AND circuit portion 51d receives the output signals MXY4 and MXY6. However, the inverter 55d inverts the output signal MXY4 input in the AND circuit portion 51d.

The OR circuit portion 51e receives output signals from the AND circuit portions 51a and 51b. The OR circuit portion 51f receives output signals from the AND circuit portions 51a and 51c. The OR circuit portions 51e and 51f output 1-bit signals MXA1 and MXA0 constituting the aforementioned 2-bit output signal MXA respectively.

The circuit portion 52 is constituted of 12 AND circuit portions 52a to 52l, four OR circuit portions 52m to 52p and three Ex-OR (exclusive OR) circuit portions 52q to 52s. The AND circuit portion 52a receives the output signals MXY3, MXY4 and MXY5. The AND circuit portion 52b receives the output signals MXY3 and MXY5. However, inverters 55c and 55e invert the output signals MXY3 and MXY5 input in the AND circuit portion 52b respectively. The AND circuit portion 52c receives the output signals MXY2, MXY3 and MXY4. However, an inverter 55b and the inverter 55d invert the output signals MXY2 and MXY4 input in the AND circuit portion 52c respectively. The Ex-OR circuit portion 52q receives the output signals MXY4 and MXY5.

The OR circuit portion 52m receives output signals from the AND circuit portions 52a and 52b. The AND circuit portion 52k receives the output signal MXY2 and an output signal from the OR circuit 52m. The AND circuit portion 52h receives the output signals MXY2 and MXY3 and an output signal from the Ex-OR circuit portion 52q. However, the inverters 55b and 55c invert the output signals MXY2 and MXY3 input in the AND circuit portion 52h respectively. The OR circuit portion 52o receives output signals from the AND circuit portions 52c, 52h and 52k. The OR circuit portion 52o outputs a 1-bit signal MXB1 constituting the aforementioned 2-bit output signal MXB.

The AND circuit portion 52d receives the output signals MXY2, MXY3, MXY4 and MXY6. However, the inverter 55d inverts the output signal MXY4 input in the AND circuit portion 52d. The Ex-OR circuit portion 52r receives the output signals MXY2 and MXY3. The AND circuit portion 52e receives the output signals MXY1, MXY2 and MXY3. However, an inverter 55a inverts the output signal MXY1 input in the AND circuit portion 52e. The AND circuit portion 52f receives the output signals MXY3 and MXY4. The Ex-OR circuit portion 52s receives the output signals MXY4 and MXY6. The AND circuit portion 52g receives the output signals MXY1, MXY2, MXY3 and MXY6. However, the inverters 55b and 55c and an inverter 55f invert the output signals MXY2, MXY3 and MXY6 input in the AND circuit portion 52g respectively.

The AND circuit portion 52i receives the output signal MXY1 and an output signal from the Ex-OR circuit portion 52r. The AND circuit portion 52j receives the output signal MXY3 and an output signal from the Ex-OR circuit portion 52s. The inverter 55c and an inverter 55g invert the output signal MXY3 and the output signal from the Ex-OR circuit portion 52s input in the AND circuit portion 52j respectively. The OR circuit portion 52n receives output signals from the AND circuit portions 52f and 52j. The AND circuit portion 52l receives the output signals MXY1 and MXY2 and an output signal from the OR circuit portion 52n. However, the inverters 55a and 55b invert the output signals MXY1 and MXY2 input in the AND circuit portion 52l respectively. The OR circuit portion 52p receives output signals from the AND circuit portions 52d, 52e, 52g, 52i and 52l. The OR circuit portion 52p outputs a 1-bit signal MAX0 constituting the aforementioned 2-bit output signal MXB.

The circuit portion 53 is constituted of nine AND circuit portions 53a to 53i, two OR circuit portions 53j and 53k and three Ex-OR circuit portions 53l to 53n. The AND circuit portion 53a receives the output signals MXY1, MXY2 and MXY3. However, the inverters 55b and 55c invert the output signals MXY2 and MXY3 input in the AND circuit portion 53a respectively. The AND circuit portion 53b receives the output signals MXY1, MXY2 and MXY3. However, the inverters 55a and 55c invert the output signals MXY1 and MXY3 input in the AND circuit portion 35b respectively. The AND circuit portion 53c receives the output signals MXY1, MXY2 and MXY3. However, the inverters 55a and 55b invert the output signals MXY1 and MXY2 input in the AND circuit portion 53c respectively. The AND circuit portion 53d receives the output signals MXY1, MXY2, MXY3, MXY4 and MXY5. However, the inverters 55a, 55b, 55c, 55d and 55e invert the output signals MXY1, MXY2, MXY3, MXY4 and MXY5 input in the AND circuit portion 53d respectively. The Ex-OR circuit portion 531 receives the output signals MXY4 and MXY5.

The AND circuit portion 53g receives the output signal MXY1 and an output signal from the Ex-OR circuit 531. The OR circuit portion 53j receives output signals from the AND circuit portions 53a, 53b, 53c, 53d and 53g. The OR circuit portion 53j outputs a 1-bit signal MXC1 constituting the aforementioned 2-bit output signal MXC.

The Ex-OR circuit portion 53m receives the output signals MXY1 and MXY4. The AND circuit portion 53e receives the output signals MXY3, MXY4, MXY5 and MXY6. However, the inverters 55d, 55e and 55f invert the output signals MXY4, MXY5 and MXY6 input in the AND circuit portion 53e respectively. The Ex-OR circuit portion 53n receives the output signals MXY3 and MXY6. The AND circuit portion 53f receives the output signals MXY1, MXY2, MXY3 and MXY4. However, the inverters 55a, 55b and 55d invert the output signals MXY1, MXY2 and MXY4 input in the AND circuit portion 53f respectively.

The AND circuit portion 53h receives the output signals MXY3 and MXY5 and an output signal from the Ex-OR circuit portion 53m. However, the inverters 55c and 55e invert the output signals MXY3 and MXY5 input in the AND circuit portion 53h respectively. The AND circuit portion 53i receives the output signals MXY4 and MXY5 and an output signal from the Ex-OR circuit portion 53n. However, an inverter 55h inverts the output signal from the Ex-OR circuit portion 53n input in the AND circuit portion 53i. The OR circuit portion 53k receives output signals from the AND circuit portions 53e, 53f, 53h and 53i. The OR circuit portion 53k outputs a 1-bit signal MXC0 constituting the aforementioned 2-bit output signal MXC.

The circuit portion 54 is constituted of four AND circuit portions 53a to 53d and two OR circuit portions 54e and 54f. The AND circuit portion 54a receives the output signals MXY2 and MXY3. However, the inverters 55b and 55c invert the output signals MXY2 and MXY3 input in the AND circuit portion 54a. The AND circuit portion 54b receives the output signals MXY4 and MXY5. However, the inverters 55d and 55e invert the output signals MXY4 and MXY5 input in the AND circuit portion 54b respectively. The AND circuit portion 54c receives the output signals MXY1 and MXY3. However, the inverters 55a and 55c invert the output signals MXY1 and MXY3 input in the AND circuit portion 54c respectively. The AND circuit portion 54d receives the output signals MXY4 and MXY6. However, the inverter 55f inverts the output signal MXY6 input in the AND circuit portion 54d.

The OR circuit portion 54e receives output signals from the AND circuit portions 54a and 54b. The OR circuit portion 54f receives output signals from the AND circuit portions 54c and 54d. The OR circuit portions 54e and 54d output 1-bit signals MXD1 and MX0 constituting the aforementioned 2-bit output signal MXD respectively.

According to the second embodiment, the comparator 50 having the aforementioned structure can detect the sequence of the access frequencies with respect to the four memory cell blocks 1a to 1d.

According to the second embodiment, a refresh control circuit 4 controls a refresh operation on the basis of the sequence data (output signals MXA to MXD) output from the comparator 50, as shown in FIG. 10.

Operations of the ferroelectric memory according to the second embodiment are now described with reference to FIGS. 10 to 13. According to the second embodiment, the ferroelectric memory performs an access operation and a refresh operation in parallel with each other.

According to the second embodiment, the comparator 50 compares the access frequencies with respect to the memory cell blocks 1a to 1d every time an access detecting portion 5 detects an access operation, similarly to the comparator 3 according to the aforementioned first embodiment. Comparison of the comparator 50 is now described with reference to a case where the access frequencies with respect to the memory cell blocks 1a, 1b, 1c and 1d are 1000 times, 1001 times, 1002 times and 1003 times respectively similarly to the aforementioned first embodiment.

When the access frequencies with respect to the memory cell blocks 1a, 1b, 1c and 1d (see FIG. 10) are 1000 times, 1001 times, 1002 times and 1003 times respectively as described above, all of the output signals MXY1 to MXY6 from the comparators 31a to 31f are "0", as shown in FIG. 12. In this case, the output signals MXA1 and MXA0 output from the circuit portion 51 are "0". The output signals MXB1 and MXB0 output from the circuit portion 52 are "0" and "1" respectively. The output signals MXB1 and MXB0 output from the circuit portion 52 are "0" and "1" respectively. The output signals MXC1 and MXC0 output from the circuit portion 53 are "1" and "0" respectively. The output signals MXD1 and MX0 output from the circuit portion 54 are "1". Thus, when the access frequencies with respect to the four memory cell blocks 1a to 1d descend in the sequence of the memory cell blocks 1d, 1c, 1b and 1a, the signals MXA, MXB, MXC and MXD (see FIG. 11) output from the comparator 50 are "00", "01", "10" and "11" respectively.

More specifically, the AND circuit portion 51a receives the three output signals MXY1, MXY2 and MXY3 having bit values "0" in the circuit portion 51. Thus, the AND circuit portion 51a outputs a signal having a bit value "0". The AND circuit portion 51b receives the two output signals MXY4 and MXY5 having bit values "0". Thus, the AND circuit portion 51b outputs a signal having a bit value "0". Therefore, the output signal MXA1 output from the OR circuit portion 51e receiving the two signals of "0" is "0".

In the circuit portion 51, the AND circuit portion 51c receives the output signal MXY3 having a bit value "0" and the output signal MXY4, inverted by the inverter 55d, having a bit value "1". Thus, the AND circuit portion 51c outputs a signal having a bit value "0". The AND circuit portion 51d receives the output signal MXY4, inverted by the inverter 55d, having the bit value "1" and the output signal MXY6 having a bit value "0". Thus, the AND circuit portion 51d outputs a signal having a bit value "0". Therefore, the output signal MXA0 output from the OR circuit portion 51f receiving the two signals of "0" is "0".

Consequently, the first and second digits of the output signal MXA corresponding to the memory cell block 1a are "0" and "0" respectively. In other words, the output signal MXA output from the comparator 50 is "00".

The circuit portions 52 to 54 operate similarly to the aforementioned circuit portion 51. In other words, the output signals MXB1 and MXB0 output from the OR circuit portions 52o and 52p are "0" and "1" respectively in the circuit portion 52. In the circuit portion 53, the output signals MXC1 and MXC0 output from the OR circuit portions 53j and 53k are "1" and "0" respectively. In the circuit portion 54, the output signals MXD1 and MXD0 output from the OR circuit portions 54e and 54f are "1" and "1" respectively.

Thus, according to the second embodiment, the comparator 50 detects the sequence of the access frequencies descending along the memory cell blocks 1d, 1c, 1b and 1a through the output signals MXA, MXB, MXC and MXD of "00", "01", "10" and "11" respectively.

If the access frequencies with respect to the four memory cell blocks 1a to 1d descend in the sequence of the memory cell blocks 1a, 1b, 1c and 1d, for example, all of the output signals MXY1 to MXY6 from the comparators 31a to 31f are "1". In this case, the output signals MXA1 and MXA0 output from the circuit portion 51 are "1". The output signals MXB1 and MXB0 output from the circuit portion 52 are "1" and "0" respectively. The output signals MXC1 and MXC0 output from the circuit portion 53 are "0" and "1" respectively. The output signals MXD1 and MXD0 output from the circuit portion 54 are "0" respectively. When the access frequencies with respect to the four memory cell blocks 1a to 1d descend in the sequence of the memory cell blocks 1a, 1b, 1c and 1d, therefore, the output signals MXA, MXB, MXC and MXD output from the comparator 50 are "11", "10", "01" and "00" respectively.

Figure 13:
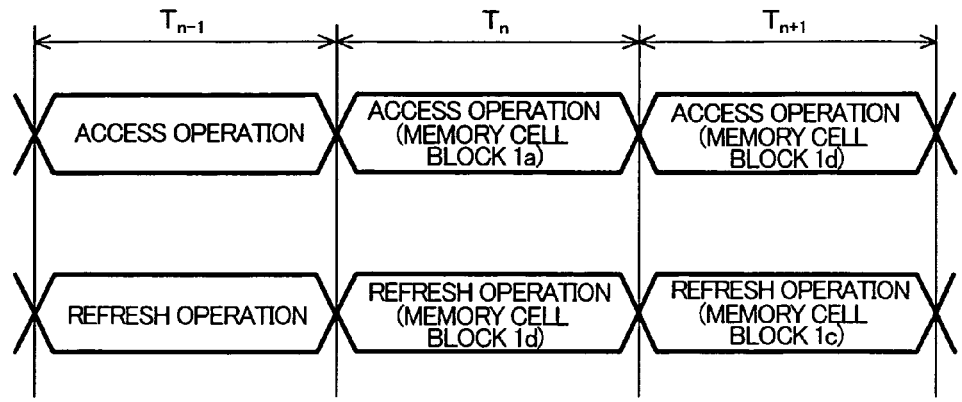
FIG. 13 is a diagram for illustrating exemplary operations of the ferroelectric memory according to the second embodiment of the present invention.

According to the second embodiment, the ferroelectric memory performs a refresh operation in parallel with an access operation, as shown in FIG. 13. A refresh operation performed after a period $T_n$ when the access frequencies with respect to the memory cell blocks 1a, 1b, 1c and 1d are 1000, 1001, 1002 and 1003 times respectively in a period $T_{n-1}$ is now described.

In the period $T_n$, the ferroelectric memory accesses memory cells (not shown) included in the memory cell block 1a. At this time, the refresh control circuit 4 selects the memory cell block 1d exhibiting the maximum access frequency from among the memory cell blocks 1b to 1d other than the memory cell block 1a on the basis of the sequence data (output signals MXA to MXD) in the period $T_{n-1}$ for an access operation precedent to the period $T_n$. When the access frequency with respect to the memory cell block 1d has reached a prescribed number of times (1000 times, for example), the refresh control circuit 4 thereafter outputs a control signal for starting a refresh operation to a row decoder 2, for refreshing memory cells (not shown) included in the memory cell block 1d. Consequently, the ferroelectric memory performs a refresh operation through one of 128 word lines included in the memory cell block 1d in the period $T_n$.

In a subsequent period $T_{n+1}$, the ferroelectric memory accesses the memory cells included in the memory cell block 1d. At this time, the refresh control circuit 4 selects the memory cell block 1c exhibiting the maximum access frequency from among the memory cell blocks 1a to 1c other than the memory cell block 1d on the basis of the sequence data (output signals MXA to MXD) in the period $T_n$ for the access operation precedent to the period $T_{n+1}$. In other words, the refresh control circuit 4 selects the memory cell block 1c exhibiting the second maximum access frequency from among the four memory cell blocks 1a to 1c in the period $T_{n+1}$. The refresh control circuit 4 exercises control for refreshing memory cells (not shown) included in the memory cell block 1c.

The remaining operations of the ferroelectric memory according to the second embodiment are similar to those of the ferroelectric memory according to the aforementioned first embodiment.

According to the second embodiment, as hereinabove described, the ferroelectric memory, provided with the comparator 50 detecting the sequence of the access frequencies with respect to the four memory cell blocks 1a to 1d by comparing the counts detected in the counter circuit portions 22a to 22d with each other, can select the one exhibiting the maximum access frequency from among the four memory cell blocks 1a to 1d with the refresh control circuit 4 every period for performing a refresh operation controlled by the refresh control circuit 4 when the access frequencies with respect to at least two of the four memory cell blocks 1a to 1d have reached the prescribed number of times requiring a refresh operation. Thus, the ferroelectric memory can preferentially refresh the memory cell block exhibiting the maximum access frequency among the four memory cell blocks 1a to 1d every period for performing a refresh operation controlled by the refresh control circuit 4. If a prescribed one of the four memory cell blocks 1a to 1d is concentrically accessed to exhibit the maximum access frequency, therefore, the ferroelectric memory can immediately refresh the prescribed memory cell block, thereby preventing the memory cells (not shown) included in the prescribed memory cell block from accumulation of disturbances. Consequently, the ferroelectric memory can suppress disappearance of data resulting from disturbances.

According to the second embodiment, as hereinabove described, the ferroelectric memory parallelly performing an access operation and a refresh operation performs the refresh operation in the period for performing an access operation, whereby refresh operations on all memory cells (not shown) in a memory cell array 1 can be ended earlier as compared with a case of performing a refresh operation only in a period for performing no access operation.

According to the second embodiment, as hereinabove described, the comparator 50 is enabled to detect the sequence of the access frequencies with respect to the four memory cell blocks 1a to 1d, so that the refresh control circuit 4 can also select the memory cell block exhibiting the second maximum access frequency from among the four memory cell blocks 1a to 1d in addition to the memory cell block exhibiting the maximum access frequency in the period for performing a refresh operation controlled by the refresh control circuit 4. If the memory cell block exhibiting the maximum access frequency is accessed in a prescribed period for performing a refresh operation when the ferroelectric memory performs the refresh operation in parallel with the access operation, therefore, the ferroelectric memory can refresh the memory cell block exhibiting the second maximum access frequency in the prescribed period.

The remaining effects of the second embodiment are similar to those of the aforementioned first embodiment.

Third Embodiment

Figure 14:
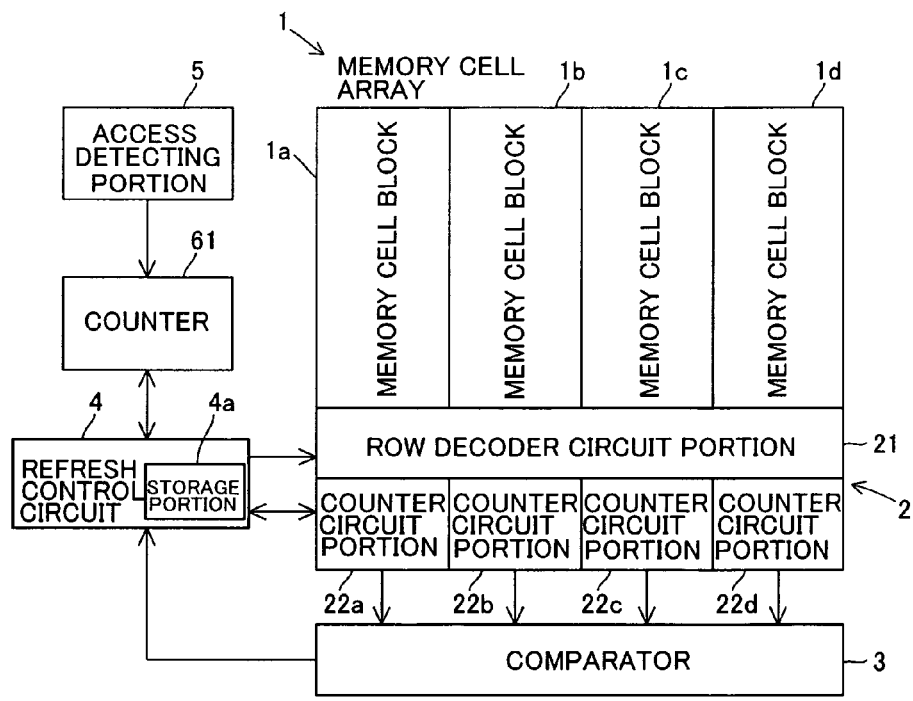
FIG. 14 is a model diagram for detailedly illustrating the structure of a ferroelectric memory according to a third embodiment of the present invention.

Referring to FIG. 14, a ferroelectric memory according to a third embodiment of the present invention detects access frequencies with respect to all memory cells in a memory cell array 1, dissimilarly to the aforementioned first and second embodiments.

As shown in FIG. 14, the ferroelectric memory according to the third embodiment is further provided with a counter 61 for detecting access frequencies with respect to all memory cells (not shown) in the memory cell array 1 in a structure similar to that of the ferroelectric memory according to the first embodiment shown in FIG. 3. The counter 61 is an example of the "second frequency detecting portion" in the present invention. This counter 61 is so formed as to increase the count thereof by +1 every time an access detecting portion 5 detects an access operation to all memory cells.

According to the third embodiment, a refresh control circuit 4 controls a refresh operation on the basis of comparison data output from a comparator 3 when the counter 61 detects that the access frequencies with respect to all memory cells in the memory cell array 1 have reached a prescribed number of times.

The remaining structure of the ferroelectric memory according to the third embodiment is similar to that of the ferroelectric memory according to the aforementioned first embodiment.

Operations of the ferroelectric memory according to the third embodiment are now described with reference to FIG. 14.

First, the counter 61 shown in FIG. 14 as well as all of four counter circuit portions 22a to 22d are reset upon power supply. Thereafter the access detecting portion 5 detects an access operation, so that the memory cells (not shown) are accessed. The counter 61 increases the count thereof by +1 every time the access detecting portion 5 detects an access operation. Among the four counter circuit portions 22a to 22d, further, the one corresponding to an accessed memory cell block also increases the count thereof by +1 every time the access detecting portion 5 detects an access operation.

According to the third embodiment, the comparator 3 compares access frequencies with respect to memory cell blocks 1a to 1d with each other every time the access detecting portion 5 detects an access operation, similarly to the aforementioned first embodiment.

According to the third embodiment, the refresh control circuit 4 selects the one exhibiting the maximum access frequency from among the four memory cell blocks 1a to 1d when the access frequencies with respect to all memory cells in the memory cell array 1 detected by the counter 61 reach the prescribed number of times. Thereafter the refresh control circuit 4 outputs a control signal for starting a refresh operation to a row decoder 2, in order to refresh the memory cells included in the selected memory cell block when the access frequency with respect to the selected memory cell block has reached the prescribed number of times (1000 times, for example).

The remaining operations of the ferroelectric memory according to the third embodiment are similar to those of the ferroelectric memory according to the aforementioned first embodiment.

According to the third embodiment, the ferroelectric memory having the aforementioned structure can select the one exhibiting the maximum access frequency from among the four memory cell blocks 1a to 1d with the refresh control circuit 4 every period for performing a refresh operation, similarly to the ferroelectric according to the aforementioned first embodiment. When a prescribed one of the four memory cell blocks 1a to 1d is concentrically accessed to exhibit the maximum access frequency, therefore, the ferroelectric memory can immediately refresh the prescribed memory cell block, thereby preventing the memory cells (not shown) included in the prescribed memory cell block from accumulation of disturbances. Consequently, the ferroelectric memory can suppress disappearance of data resulting from disturbances similarly to the ferroelectric memory according to the aforementioned first embodiment.

According to the third embodiment, as hereinabove described, the ferroelectric memory is provided with the counter 61 detecting the access frequencies with respect to all memory cells (not shown) in the memory cell array 1 for selecting the one exhibiting the maximum access frequency from among the four memory cell blocks 1a to 1d on the basis of comparison data output from the comparator 3 while refreshing the memory cells included in the selected memory cell block exhibiting the maximum access frequency when the counter 61 detects that the total access frequency with respect to all memory cells in the memory cell 1 has reached the prescribed number of times, thereby periodically refreshing the memory cells every constant access frequency dissimilarly to a case of detecting the access frequencies with respect to the four memory cell blocks 1a to 1d respectively and refreshing the memory cells every prescribed access frequency with respect to each of the four memory cell blocks 1a to 1d. Thus, the ferroelectric memory can exercise control such as that for temporarily queuing a normal access operation at the time of a refresh operation, whereby control of the ferroelectric memory can be simplified.

The remaining effects of the third embodiment are similar to those of the aforementioned first embodiment.

Fourth Embodiment

Figure 15:
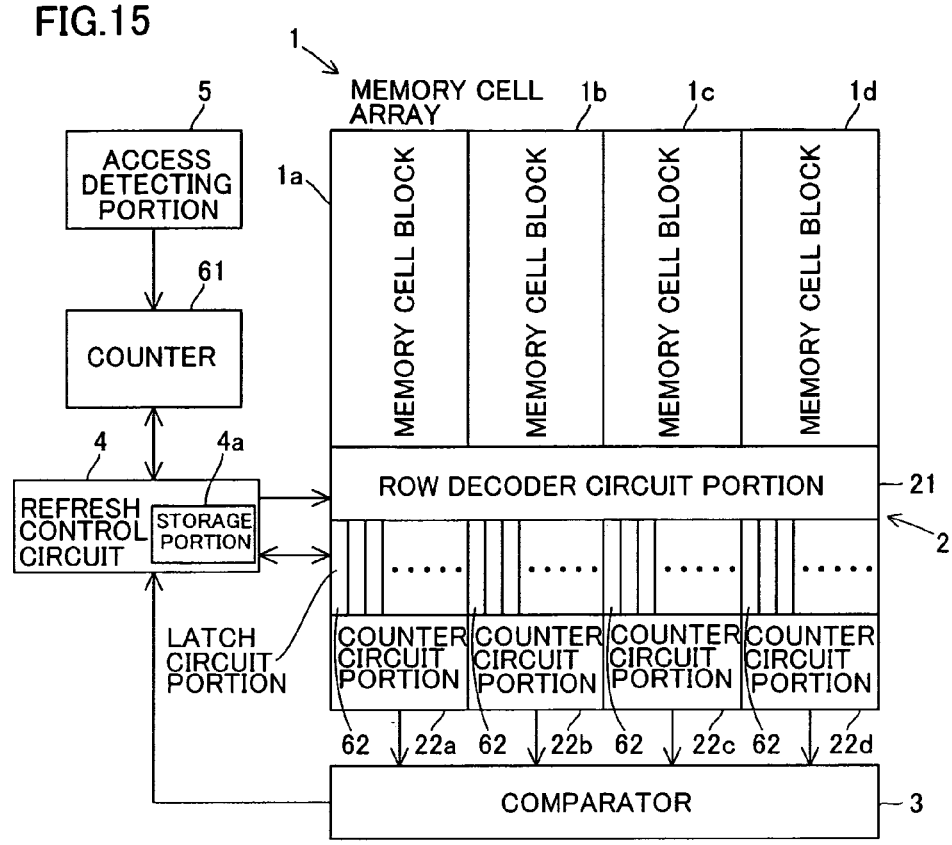
FIG. 15 is a model diagram for detailedly illustrating the structure of a ferroelectric memory according to a fourth embodiment of the present invention.
Figure 16:
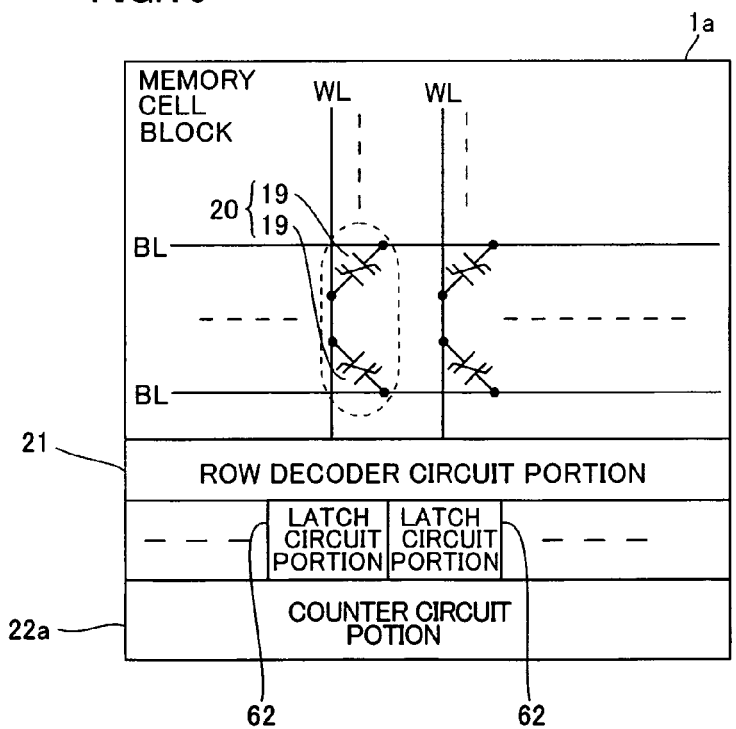
FIG. 16 is a model diagram for detailedly illustrating the structures of a memory cell block and a row decoder in the ferroelectric memory according to the fourth embodiment shown in FIG. 15.

Referring to FIGS. 15 and 16, a ferroelectric memory according to a fourth embodiment of the present invention holds presence/absence of an access operation every prescribed number of memory cells 20 connected to each of a plurality of word lines WL in a structure similar to that of the ferroelectric memory according to the aforementioned third embodiment.

As shown in FIGS. 15 and 16, latch circuit portions 62 are provided one by one for the plurality of word lines WL respectively in the ferroelectric memory according to the fourth embodiment in the structure similar to that of the ferroelectric memory according to the third embodiment shown in FIG. 14. The latch circuit portions 62 are examples of the "holding portion" in the present invention. Each latch circuit portion 62 has a function of holding presence/absence of an access operation every prescribed number of memory cells 20 connected to the corresponding one of the plurality of word lines WL. More specifically, each latch circuit portion 62 is so formed as to hold high-level data when the corresponding memory cells 20 are accessed through the corresponding word line WL while holding low-level data when none of the corresponding memory cells 20 are accessed through the corresponding word line WL.

According to the fourth embodiment, a refresh control circuit 4 controls a refresh operation on the basis of comparison data output from a comparator 3 and the data held in the latch circuit portions 62 when a counter 61 detects that access frequencies with respect to all memory cells 20 in a memory cell array 1 have reached a prescribed number of times.

The remaining structure of the ferroelectric memory according to the fourth embodiment is similar to that of the ferroelectric memory according to the aforementioned third embodiment.

Operations of the ferroelectric memory according to the fourth embodiment are now described with reference to FIGS. 15 and 16.

When a prescribed memory cell 20 is accessed, the ferroelectric memory according to the fourth embodiment converts the data held in the latch circuit portion 62 corresponding to the word line WL connected with the prescribed memory cell 20 to a high level.

If all of the plurality of latch circuit portions 62 corresponding to a memory cell block 1a hold high-level data when a counter circuit portion 22a detects that the access frequency with respect to the memory cell block 1a has reached a prescribed number of times (1000 times, for example), for example, the ferroelectric memory converts and fixes the data held in all latch circuit portions 62 corresponding to the memory cell block 1a to low levels. When the data held in the plurality of latch circuit portions 62 corresponding to the memory cell block 1a include both of high and low levels, on the other hand, the ferroelectric memory converts and fixes the data held in all latch circuit portions 62 corresponding to the memory cell block 1a to high levels.

When the access frequencies with respect to all memory cells 20 in the memory cell array 1 detected by the counter 61 reach the prescribed number of times, the refresh control circuit 4 selects the one exhibiting the maximum access frequency from among four memory cell blocks, i.e., the memory cell block 1a and memory cell blocks 1b to 1d in the ferroelectric memory according to the fourth embodiment. Thereafter the refresh control circuit 4 outputs a control signal for starting a refresh operation to a row decoder 2 for refreshing the memory cells 20 included in the selected memory cell block when the access frequency with respect to the selected memory cell block has reached the prescribed number of times (1000 times, for example).

At this time, the refresh control circuit 4 outputs a row address for selecting a word line WL subjected to a refresh operation to a row decoder circuit portion 2a on the basis of the data held in the latch circuit portions 62 corresponding to the selected memory cell block. In other words, the refresh control circuit 4 outputs the row addresses of all word lines WL included in the selected memory cell block to the row decoder circuit portion 2a when all latch circuit portions 62 corresponding to the selected memory cell block hold high-level data. When all latch circuit portions 62 corresponding to the selected memory cell block hold low-level data, on the other hand, the refresh control circuit 4 does not output the row addresses of all word lines WL included in the selected memory cell block to the row decoder circuit portion 2a. Thus, the ferroelectric memory does not refresh the memory cells 20 included in the selected memory cell block when the memory cells 20 included in the selected memory cell block are accessed through all word lines WL included in the selected memory cell block and when none of the memory cells 20 are accessed through the word lines WL included in the selected memory cell block.

When the word lines WL provided in the selected memory cell block include those subjected to the access operation and those subjected to no access operation, on the other hand, the ferroelectric memory refreshes the memory cells 20 included in the selected memory cell block.

The ferroelectric memory does not refresh the memory cells 20 included in the selected memory cell block when the memory cells 20 are accessed through all word lines WL included in the selected memory cell block for the following reason: When the memory cells 20 are accessed through all word lines WL included in the selected memory cell block, the memory cells 20 included in the selected memory cell block are conceivably relatively uniformly accessed and hence conceivably relatively slightly influenced by disturbances.

The remaining operations of the ferroelectric memory according to the fourth embodiment are similar to those of the ferroelectric memory according to the aforementioned first embodiment.

According to the fourth embodiment, the ferroelectric memory having the aforementioned structure can select the one exhibiting the maximum access frequency from among the four memory cell blocks 1a to 1d every period for performing a refresh operation with the refresh control circuit 4, similarly to the aforementioned first embodiment. When a prescribed one of the four memory cell blocks 1a to 1d is concentrically accessed to exhibit the maximum access frequency, therefore, the ferroelectric memory can immediately refresh the prescribed memory cell block, thereby preventing the memory cells 20 included in the prescribed memory cell block from accumulation of disturbances. Consequently, the ferroelectric memory can suppress disappearance of data resulting from disturbances.

According to the fourth embodiment, as hereinabove described, the ferroelectric memory, provided with the latch circuit portions 62 each holding presence/absence of an access operation every prescribed number of memory cells 20 connected to each of the plurality of word lines WL, can exercise control for performing no access operation on a prescribed memory cell block included in the four memory cell blocks 1a to 1d when the memory cells 20 of the prescribed memory cell block are accessed through all word lines WL corresponding to the prescribed memory cell block. Thus, the frequency of disturbances caused in the memory cells 20 in a refresh operation can be reduced.

The remaining effects of the ferroelectric memory according to the fourth embodiment are similar to those of the ferroelectric memory according to the aforementioned third embodiment.

Although the present invention has been described and illustrated in detail, it is clearly understood that the same is by way of illustration and example only and is not to be taken by way of limitation, the spirit and scope of the present invention being limited only by the terms of the appended claims.

For example, while each of the aforementioned first to fourth embodiments is applied to the ferroelectric memory employed as an exemplary memory according to the present invention, the present invention is not restricted to this but is also applicable to a nonvolatile memory other than the ferroelectric memory.

While 128 word lines are provided for each memory cell block in each of the aforementioned first to fourth embodiments, the present invention is not restricted to this but a prescribed number, other than 128, of word lines may alternatively be provided for each memory cell block.

While the ferroelectric memory according to the aforementioned first embodiment selects the memory cell block subjected to a refresh operation on the basis of the output signals output from the comparison circuit every period for performing a refresh operation, the present invention is not restricted to this but the ferroelectric memory may alternatively exercise control for continually refreshing memory cells in a prescribed memory cell block until completely refreshing all memory cells included in the prescribed memory cell block when selecting the prescribed memory cell block. According to this structure, the ferroelectric memory may not be separately provided with a storage portion storing the stage of the refresh operation in the prescribed memory cell block as in a case of exchanging the memory cell block subjected to the refresh operation in a stage not yet completely refreshing all memory cells included in the prescribed memory cell block. Thus, the structure of the ferroelectric memory can be simplified. When concentrically accessing a memory cell block exhibiting an access frequency fourthly reaching a prescribed number of times requiring a refresh operation while refreshing a memory cell block exhibiting an access frequency firstly reaching the prescribed number of times requiring a refresh operation, for example, the ferroelectric memory can refresh the memory cell block exhibiting the access frequency fourthly reaching the prescribed number of times requiring a refresh operation when completely refreshing all memory cells of the memory cell block exhibiting the access frequency firstly reaching the prescribed number of times requiring a refresh operation. Also when exercising control for continually refreshing the memory cell block exhibiting the access frequency firstly reaching the prescribed number of times requiring a refresh operation until completely refreshing the memory cells included in this memory cell block, therefore, the ferroelectric memory can prevent the memory cells included in the memory cell block exhibiting the access frequency fourthly reaching the prescribed number of times requiring a refresh operation from accumulation of disturbances.

While the ferroelectric memory according to the aforementioned first embodiment selects the one exhibiting the maximum access frequency from among the four memory cell blocks and refreshes the selected memory cell block on the basis of the output signals output from the comparator in the prescribed period for performing a refresh operation, the present invention is not restricted to this but the ferroelectric memory may alternatively refresh the memory cell block selected in the aforementioned prescribed period in another period subsequent to the prescribed period.

While the ferroelectric memory according to the second embodiment performs a refresh operation in parallel with an access operation, the present invention is not restricted to this but the ferroelectric memory may alternatively perform a refresh operation in a period other than the period for performing an access operation.

While the ferroelectric memory according to the second embodiment exercises control for refreshing the memory cell block exhibiting the maximum access frequency among the three memory cell blocks other than the accessed memory cell block in the case of performing a refresh operation in parallel with an access operation, the present invention is not restricted to this but the ferroelectric memory may alternatively exercise control for refreshing a memory cell block exhibiting the second or third maximum access frequency among the three memory cell blocks other than the accessed memory cell block.

What is claimed is:

1. A memory comprising:
a memory cell array including a plurality of memory cell blocks each having a plurality of nonvolatile memory cells;
a first frequency detecting portion detecting access frequencies with respect to said plurality of memory cell blocks respectively;
a comparator comparing said access frequencies with respect to said plurality of memory cell blocks detected by said first frequency detecting portion with each other; and
a refresh portion exercising control for selecting a memory cell block from among said plurality of memory cell blocks on the basis of comparison data output from said comparator and preferentially rewriting data in said memory cells included in said selected memory cell block.

2. The memory according to claim 1, wherein
said comparator detects a memory cell block exhibiting the maximum access frequency among said plurality of memory cell blocks, and
said refresh portion exercises control for preferentially rewriting data in said memory cells included in said memory cell block exhibiting the maximum access frequency.

3. The memory according to claim 1, wherein
said comparator detects the sequence of the access frequencies with respect to said plurality of memory cell blocks, and
said refresh portion exercises control for selecting said memory cell block from among said plurality of memory cell blocks on the basis of sequence data output from said comparator and rewriting data in said memory cells included in said selected memory cell block.

4. The memory according to claim 1, wherein
said refresh portion rewrites data in parallel with an access operation.

5. The memory according to claim 4, wherein
said refresh portion exercises control for preferentially rewriting data in said memory cells included in a memory cell block exhibiting the maximum access frequency among said memory cell blocks, included in said plurality of memory cell blocks, other than a memory cell block subjected to said access operation.

6. The memory according to claim 5, wherein
said refresh portion exercises control for rewriting data in said memory cells included in said memory cell block exhibiting the second maximum access frequency among said plurality of memory cell blocks when said access operation is performed on said memory cell block exhibiting the maximum access frequency among said plurality of memory cell blocks.

7. The memory according to claim 1, wherein
said refresh portion rewrites data in a period including no access operation.

8. The memory according to claim 1, wherein
said refresh portion rewrites data simultaneously with an access operation in a cycle period.

9. The memory according to claim 1, wherein
said refresh portion selects said selected memory cell block, to be subjected to a rewrite-operation controlled by said refresh portion on the basis of said comparison data output from said comparator every period for performing a rewrite operation controlled by said refresh portion.

10. The memory according to claim 1, wherein
said refresh portion exercises control for continually rewriting data in said selected memory cell block until completely rewriting data in all said memory cells included in said selected memory cell block.

11. The memory according to claim 1, further comprising a second frequency detecting portion detecting access frequencies with respect to all said memory cells provided in said memory cell array, wherein
said refresh portion exercises control for selecting said selected memory cell block from among said plurality of memory cell blocks on the basis of said comparison data output from said comparator and preferentially rewriting data in said memory cells included in said selected memory cell block when said second frequency detecting portion detects that the total access frequency with respect to all memory cells has reached a prescribed number of times.

12. The memory according to claim 11, further comprising:
a plurality of word lines each connected with a prescribed number of said memory cells, and
a holding portion holding presence/absence of an access operation every said prescribed number of memory cells connected to each of said plurality of word lines, wherein
said refresh portion exercises control for selecting said selected memory cell block from among said plurality of memory cell blocks on the basis of said comparison data output from said comparator and data held in said holding portion and rewriting data in said memory cells included in said selected memory cell block when said second frequency detecting portion detects that the total access frequency with respect to all said memory cells has reached said prescribed number of times.

13. The memory according to claim 12, wherein
said refresh portion exercises control for rewriting no data in said memory cells included in said selected memory cell block when said selected memory cell block is accessed through all said word lines included in said selected memory cell block.

14. The memory according to claim 1, wherein
said refresh portion exercises control for preferentially rewriting data in said memory cells included in said selected memory cell block when the access frequency with respect to said selected memory cell block has reached a prescribed number of times.

15. The memory according to claim 1, further comprising a plurality of word lines each connected with a prescribed number of said memory cells, wherein
said refresh portion exercises control for rewriting data in said plurality of memory cells linked to a single one of said word lines with respect to said memory cells included in said selected memory cell block.

16. The memory according to claim 15, further comprising a storage portion storing the range of said word lines of said memory cell blocks subjected to rewrite operations.

17. The memory according to claim 1, wherein
said memory cells include ferroelectric capacitors having ferroelectric films.

* * * * *